(12) United States Patent
Jeong et al.

(10) Patent No.: US 11,963,362 B2
(45) Date of Patent: Apr. 16, 2024

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Seonghun Jeong, Hwaseong-si (KR); Byoungil Lee, Hwaseong-si (KR); Bosuk Kang, Seoul (KR); Joonhee Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 363 days.

(21) Appl. No.: 17/202,992

(22) Filed: Mar. 16, 2021

(65) Prior Publication Data

US 2022/0045082 A1    Feb. 10, 2022

(30) Foreign Application Priority Data

Aug. 10, 2020  (KR) .................. 10-2020-0100045

(51) Int. Cl.
*H01L 21/76* (2006.01)
*H01L 21/768* (2006.01)
(Continued)

(52) U.S. Cl.
CPC ....... *H10B 43/50* (2023.02); *H01L 21/76805* (2013.01); *H01L 21/76895* (2013.01);
(Continued)

(58) Field of Classification Search
CPC ........ H10B 43/50; H10B 41/50; H10B 43/40; H10B 41/27; H10B 41/41
See application file for complete search history.

(56) References Cited

U.S. PATENT DOCUMENTS 9,793,293 B1 * 10/2017 Horibe ............... H10B 41/27
2013/0256775 A1   10/2013 Shim et al.
(Continued)

FOREIGN PATENT DOCUMENTS

KR    20180000656 A    1/2018
KR    20180042358 A    4/2018
(Continued)

*Primary Examiner* — Ali Naraghi
*Assistant Examiner* — Siangluai Mang
(74) *Attorney, Agent, or Firm* — Myers Bigel, P.A.

(57) ABSTRACT

A semiconductor device includes a peripheral circuit structure including a first substrate and circuit elements on the first substrate; and a memory cell structure including a second substrate on the first substrate, a first horizontal conductive layer on the second substrate, a second horizontal conductive layer on the first horizontal conductive layer, gate electrodes spaced apart from each other and stacked on the second horizontal conductive layer, channel structures penetrating through the gate electrodes, and separation regions penetrating the gate electrodes, extending, and spaced apart from each other. The semiconductor device has a through-wiring region including a through-contact plug electrically connecting the memory cell structure and the peripheral circuit structure, the separation regions include first separation regions adjacent to the through-contact plug, and the first separation regions penetrate through the second horizontal conductive layer and are spaced apart from the first horizontal conductive layer.

16 Claims, 24 Drawing Sheets

(51) Int. Cl.
*H01L 23/535* (2006.01)
*H10B 41/27* (2023.01)
*H10B 41/41* (2023.01)
*H10B 41/50* (2023.01)
*H10B 43/27* (2023.01)
*H10B 43/40* (2023.01)
*H10B 43/50* (2023.01)

(52) U.S. Cl.
CPC .......... *H01L 23/535* (2013.01); *H10B 41/27* (2023.02); *H10B 41/41* (2023.02); *H10B 41/50* (2023.02); *H10B 43/27* (2023.02); *H10B 43/40* (2023.02)

(56) References Cited

U.S. PATENT DOCUMENTS

| | | | |
|---|---|---|---|
| 2014/0187029 A1* | 7/2014 | Seol | H01L 29/7889 |
| | | | 438/618 |
| 2016/0358927 A1* | 12/2016 | Nam | H01L 21/02667 |
| 2017/0011996 A1* | 1/2017 | Lee | H01L 21/76877 |
| 2017/0250194 A1* | 8/2017 | Lee | H10B 43/50 |
| 2017/0373089 A1 | 12/2017 | Kim et al. | |
| 2018/0308856 A1* | 10/2018 | Cho | H10B 43/27 |
| 2019/0148399 A1 | 5/2019 | Jung et al. | |
| 2019/0157294 A1 | 5/2019 | Kanamori et al. | |
| 2019/0164991 A1* | 5/2019 | Lim | G11C 16/0483 |
| 2019/0319038 A1* | 10/2019 | Zhang | H01L 23/535 |
| 2019/0326315 A1 | 10/2019 | Lee et al. | |
| 2019/0333931 A1 | 10/2019 | Jung et al. | |
| 2020/0051997 A1 | 2/2020 | Park | |
| 2020/0091170 A1 | 3/2020 | Baek | |

FOREIGN PATENT DOCUMENTS

| | | |
|---|---|---|
| KR | 20190054470 A | 5/2019 |
| KR | 20190058079 A | 5/2019 |
| KR | 20190123050 A | 10/2019 |
| KR | 20190125811 A | 11/2019 |
| KR | 20200018064 A | 2/2020 |
| KR | 20200030760 A | 3/2020 |
| WO | 2017087670 A1 | 5/2017 |

* cited by examiner

SEMICONDUCTOR DEVICES AND DATA STORAGE SYSTEMS INCLUDING THE SAME

CROSS-REFERENCE TO RELATED APPLICATION(S)

This application claims the benefit and priority from under 35 U.S.C. 119(a) of Korean Patent Application No. 10-2020-0100045 filed on Aug. 10, 2020 in the Korean Intellectual Property Office, the entire disclosure of which is incorporated herein by reference for all purposes.

FIELD

The present inventive concept relates to a semiconductor device and a data storage system including the same.

BACKGROUND

In data storage systems requiring data storage, semiconductor devices capable of storing high-capacity data may be required. Accordingly, methods of increasing the data storage capacity of a semiconductor device are being researched. For example, as a method for increasing the data storage capacity of a semiconductor device, a semiconductor device including memory cells arranged three-dimensionally (instead of two-dimensionally) has been proposed.

SUMMARY

Example embodiments provide a semiconductor device having improved reliability.

Example embodiments provide a data storage system including a semiconductor device with improved reliability.

According to example embodiments, a semiconductor device includes a peripheral circuit structure comprising a first substrate and circuit elements on the first substrate; a memory cell structure comprising a second substrate on the first substrate, gate electrodes spaced apart from each other and stacked in a first direction that is perpendicular to a surface of the second substrate, channel structures extending through the gate electrodes in the first direction, each of the channel structures comprising a channel layer, separation regions penetrating through the gate electrodes and extending in a second direction that is perpendicular to the first direction and spaced apart from each other in a third direction that is perpendicular to the first direction and the second direction, a first horizontal conductive layer extending on the second substrate and in contact with the channel layer of each of the channel structures, a horizontal insulating layer extending in parallel with the first horizontal conductive layer, and a second horizontal conductive layer on the first horizontal conductive layer and in contact with support regions of the second substrate, wherein the support regions are free of the first horizontal conductive layer and the horizontal insulating layer; and a through-wiring region between first separation regions among the separation regions, the through-wiring region comprising an insulating region and through-contact plugs extending through the insulating region and through the second substrate in the first direction to electrically connect the memory cell structure and the peripheral circuit structure, where first portions of the support regions extend along the first separation regions.

According to example embodiments, a semiconductor device includes a peripheral circuit structure comprising a first substrate and circuit elements on the first substrate; a memory cell structure comprising a second substrate on the first substrate, a first horizontal conductive layer extending on the second substrate, a second horizontal conductive layer on the first horizontal conductive layer, gate electrodes spaced apart from each other and stacked on the second horizontal conductive layer in a first direction, channel structures extending through the gate electrodes in the first direction and each comprising a channel layer, and separation regions penetrating the gate electrodes and extending in a second direction and spaced apart from each other in a third direction; and a through-wiring region comprising a through-contact plug extending in the first direction and electrically connecting the memory cell structure and the peripheral circuit structure, where the separation regions comprise first separation regions adjacent to the through-contact plug in the third direction, and where the first separation regions extend through the second horizontal conductive layer and are spaced apart from the first horizontal conductive layer.

According to example embodiments, a data storage system includes a semiconductor storage device, and a controller electrically connected to the semiconductor storage device through an input/output pad. The semiconductor storage device includes a peripheral circuit structure comprising a first substrate and circuit elements on the first substrate; a memory cell structure comprising a second substrate on the first substrate, a first horizontal conductive layer extending on the second substrate, a second horizontal conductive layer on the first horizontal conductive layer, gate electrodes spaced apart from each other and stacked on the second horizontal conductive layer in a first direction, channel structures extending through the gate electrodes in the first direction and each comprising a channel layer, and separation regions penetrating through the gate electrodes and extending in a second direction and spaced apart from each other in a third direction; the input/output pad electrically connected to the circuit elements; and a through-wiring region comprising a through-contact plug extending in the first direction and electrically connecting the memory cell structure and the peripheral circuit structure, the separation regions comprising first separation regions adjacent to the through-contact plug in the third direction, where the first separation regions extend through the second horizontal conductive layer and are spaced apart from the first horizontal conductive layer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
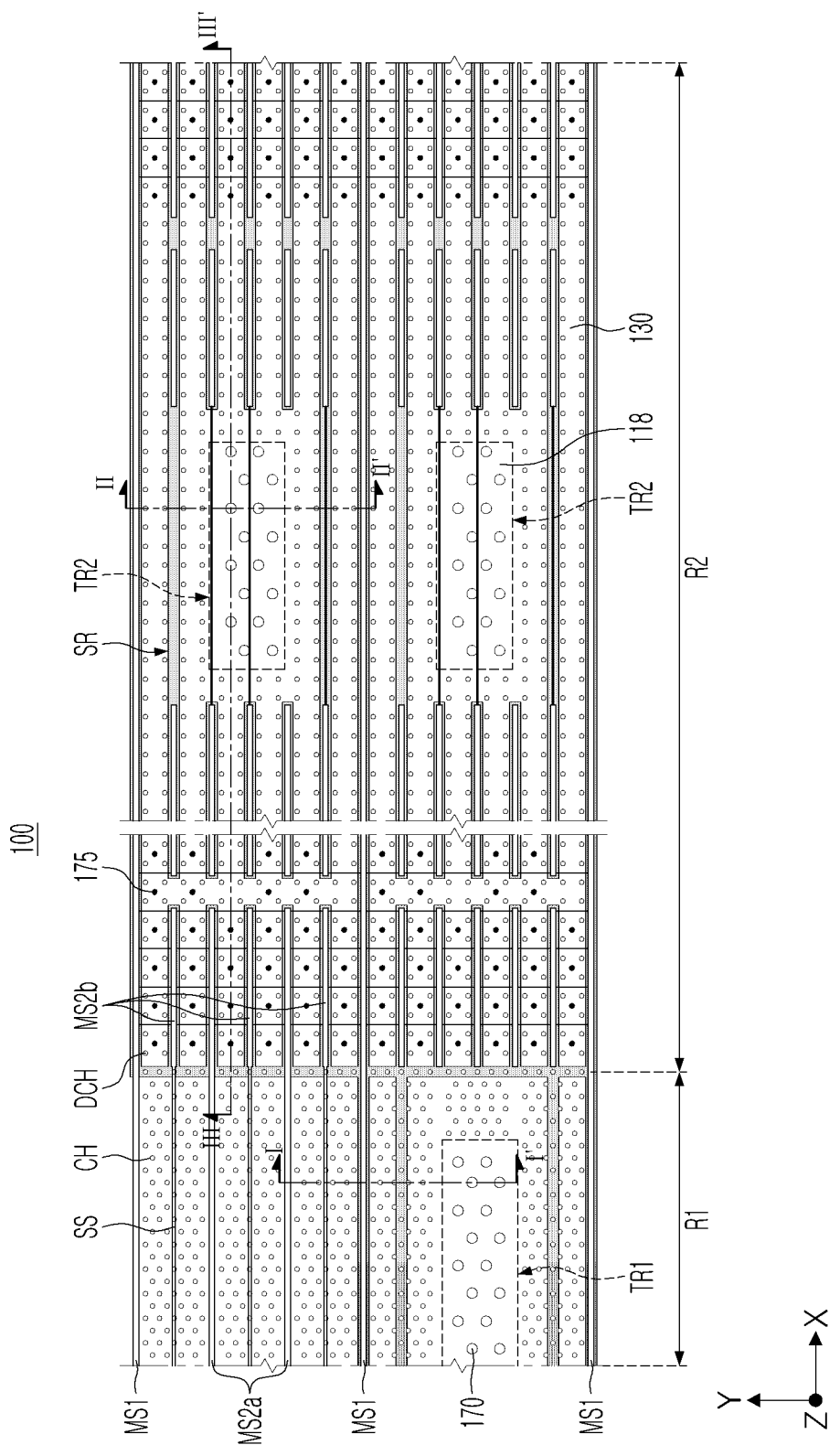
FIG. 1 is a schematic plan view of a semiconductor device according to example embodiments.

FIG. 1 is a schematic plan view of a semiconductor device according to example embodiments.

Figure 2A:
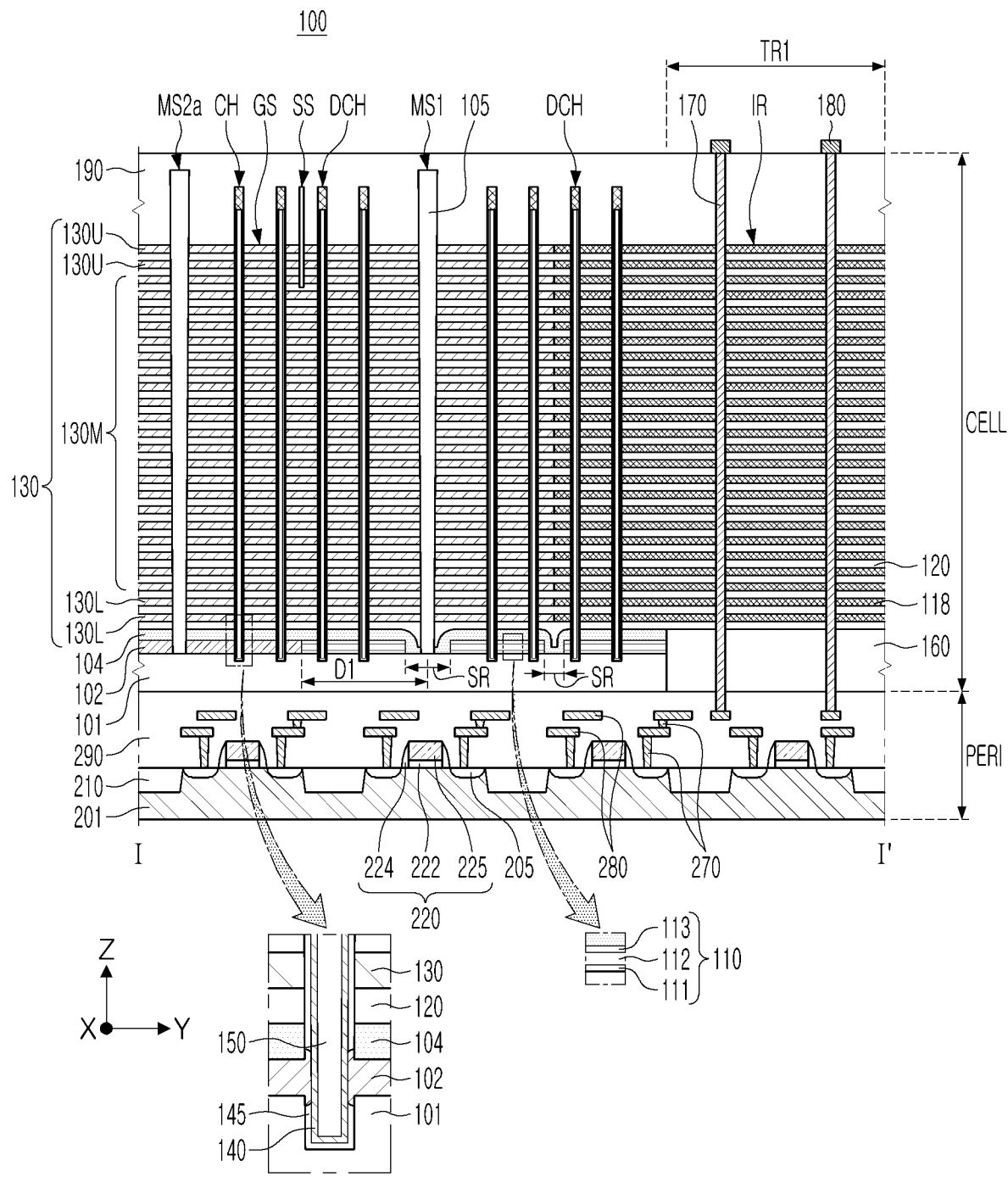
FIGS. 2A to 2C are schematic cross-sectional views of a semiconductor devices according to example embodiments.
Figure 2B:
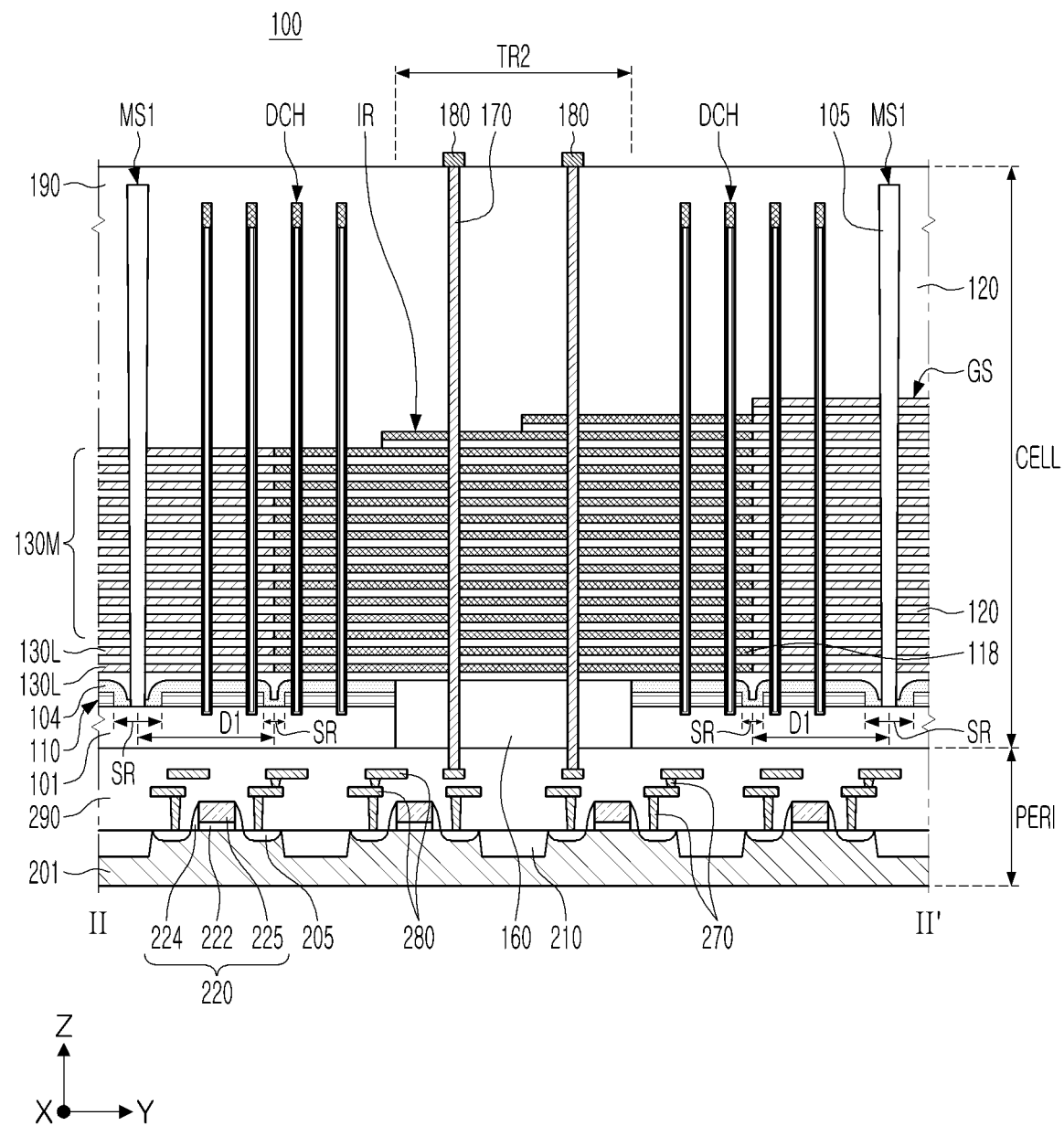
Figure 2C:
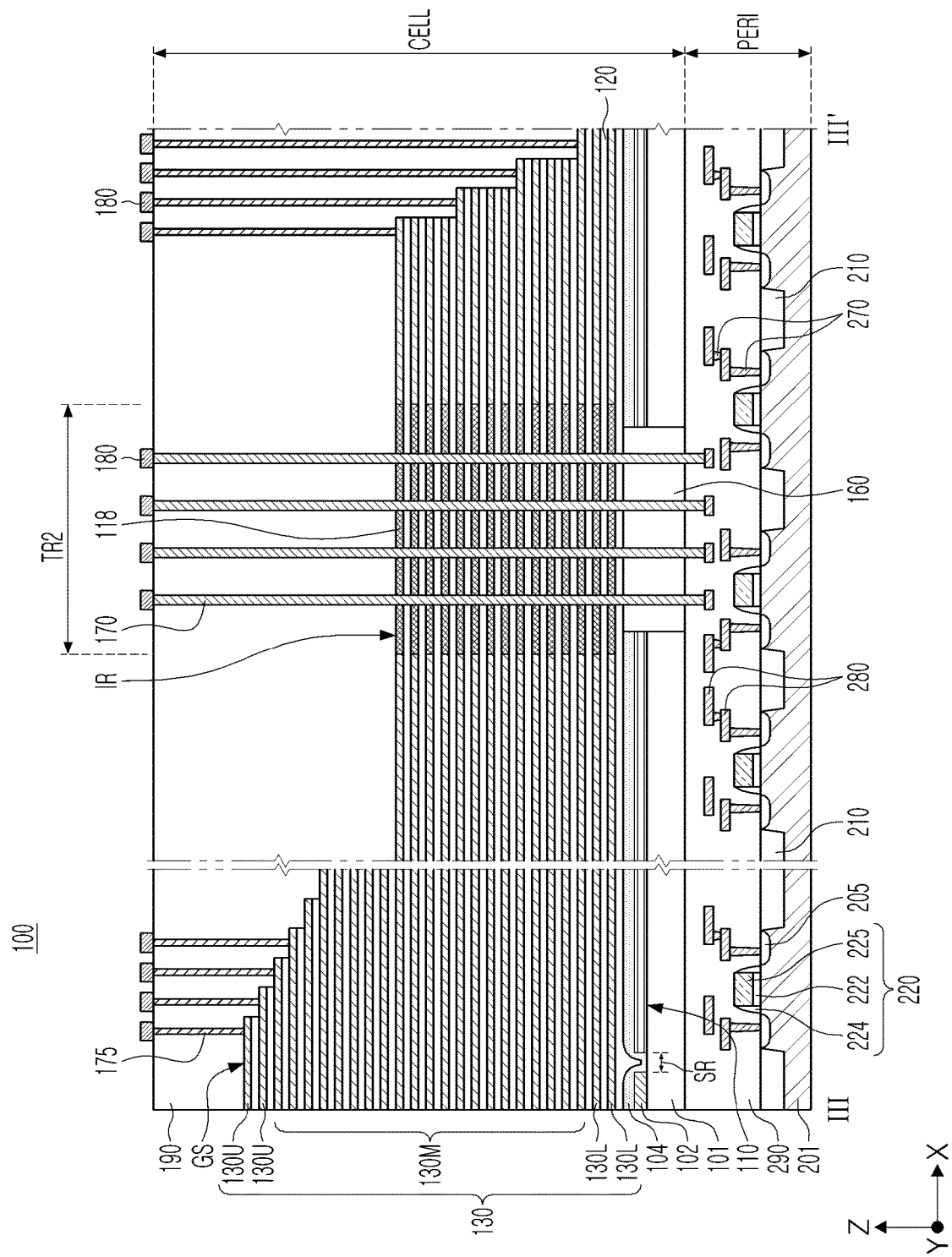

FIGS. 2A to 2C are schematic cross-sectional views of semiconductor devices according to example embodiments. FIGS. 2A to 2C illustrate cross-sectional views taken along lines I-I', and of FIG. 1, respectively.

Referring to FIGS. 1 to 2C, a semiconductor device 100 includes a peripheral circuit structure PERI including a first substrate 201, and a memory cell structure CELL including a second substrate 101, and may include first and second through-wiring regions TR1 and TR2 each including a through-contact plug 170 electrically connecting the peripheral circuit structure PERI and the memory cell structure CELL. The terms first, second, etc. may be used herein merely to distinguish one element from another. The memory cell structure CELL may be disposed on the peripheral circuit structure PERI, and the first and second through-wiring regions TR1 and TR2 penetrate through the memory cell structure CELL to connect the memory cell structure CELL and the peripheral circuit structure PERI to each other. Conversely, in example embodiments, the memory cell structure CELL may be disposed below the peripheral circuit structure PERI.

The peripheral circuit structure PERI may include the first substrate 201, source/drain regions 205 and device isolation layers 210 in the first substrate 201, and circuit elements 220, circuit contact plugs 270, circuit wiring lines 280 and a peripheral region insulating layer 290 which are disposed on the first substrate 201.

The first substrate 201 may have an upper surface extending in X and Y directions. An active region may be defined by the device isolation layers 210 in the first substrate 201. The source/drain regions 205 including impurities may be disposed in a portion of the active region. The first substrate 201 may include a semiconductor material, for example, a group IV semiconductor, a group III-V compound semiconductor, or a group II-VI compound semiconductor. The first substrate 201 may be provided as a bulk wafer or an epitaxial layer.

The circuit elements 220 may include a planar transistor. Each of the circuit elements 220 may include a circuit gate dielectric layer 222, a spacer layer 224, and a circuit gate electrode 225. The source/drain regions 205 may be disposed in the first substrate 201 on both sides of the circuit gate electrode 225.

The peripheral region insulating layer 290 may be disposed on the circuit element 220, on the first substrate 201.

The circuit contact plugs 270 may penetrate through the peripheral region insulating layer 290 and are connected to the source/drain regions 205. An electrical signal may be applied to the circuit element 220 by the circuit contact plugs 270. In a region not illustrated, the circuit contact plugs 270 may also be connected to the circuit gate electrode 225. The circuit wiring lines 280 may be connected to the circuit contact plugs 270 and may be disposed in a plurality of layers.

The memory cell structure CELL may include a second substrate 101 having a first region R1 and a second region R2, a first horizontal conductive layer 102 on the first region R1 of the second substrate 101, a horizontal insulating layer 110 disposed in parallel with the first horizontal conductive layer 102, on the second region R2 of the second substrate 101, a second horizontal conductive layer 104 on the first horizontal conductive layer 102 and the horizontal insulating layer 110, gate electrodes 130 stacked on the second horizontal conductive layer 104, first and second separation regions MS1, MS2a and MS2b extending while penetrating through a stacked structure GS of the gate electrodes 130, upper separation regions SS penetrating through a portion of the stacked structure GS, and channel structures CH disposed to penetrate through the stacked structure GS. The memory cell structure CELL may further include interlayer insulating layers 120 alternately stacked with the gate electrodes 130, on the second substrate 101, wiring lines 180, and a cell region insulating layer 190.

The first region R1 of the second substrate 101 may be a region in which the gate electrodes 130 are vertically stacked and the channel structures CH are disposed, and may be a region in which memory cells are disposed. The second region R2 may be a region in which the gate electrodes 130 extend with different lengths, and may correspond to a region for electrically connecting the memory cells to the peripheral circuit structure PERI. The second region R2 may be disposed on at least one end of the first region R1 in at least one direction, for example, in the X direction.

The second substrate 101 may have an upper surface extending in the X and Y directions. The second substrate 101 may include a semiconductor material, such as a group IV semiconductor, a group III-V compound semiconductor, or a group II-VI compound semiconductor. For example, the group IV semiconductor may include silicon, germanium, or silicon-germanium. The second substrate 101 may further include impurities. The second substrate 101 may be provided as an epitaxial layer or a polycrystalline semiconductor layer such as a polycrystalline silicon layer.

The first and second horizontal conductive layers 102 and 104 may be sequentially stacked and disposed on an upper surface of the first region R1 of the second substrate 101. The first horizontal conductive layer 102 may not extend to the second region R2 of the second substrate 101, and the second horizontal conductive layer 104 may extend to the second region R2.

The first horizontal conductive layer 102 may function as a portion of a common source line (CSL) of the semiconductor device 100, for example, may function as a common source line together with the second substrate 101. As illustrated in the enlarged view of FIG. 2A, the first horizontal conductive layer 102 may be disposed around a channel layer 140 and may be directly connected to the channel layer 140. As used herein, when elements are described as "directly connected" or "directly on" or "directly contacting" each other, no intervening elements are present.

The second horizontal conductive layer 104 may contact the second substrate 101 in support regions SR in which the first horizontal conductive layer 102 and the horizontal insulating layer 110 are not disposed. The second horizontal conductive layer 104 may be bent or conformal to cover an end of the first horizontal conductive layer 102 or the horizontal insulating layer 110 in the support regions SR and extend onto the second substrate 101. The support regions SR may be regions for supporting an upper structure including the second horizontal conductive layer 104 when the first horizontal conductive layer 102 is formed.

As illustrated in FIG. 1, in the first region R1, a portion of the support regions SR overlaps with the first separation regions MS1 adjacent to the first through-wiring region TR1 and extend in the X direction. In the present specification, "overlapping" indicates that two areas overlap on a layout (e.g., in plan view). However, as illustrated in FIGS. 2A and 2B, the first separation regions MS1 have a structure disposed to penetrate through the support regions SR, and may not be a structure in which the first separation regions MS1 are disposed on the second horizontal conductive layer 104 of the support regions SR. A portion of the support regions SR may extend along the first separation regions MS1 adjacent to the first through-wiring region TR1. Support regions SR may be further disposed between the first through-wiring region TR1 and adjacent ones of the first separation regions MS1 disposed to overlap the support regions SR. At the boundary between the first region R1 and the second region R2, the support region SR may be disposed to extend in the Y direction. However, according to example embodiments, the support region SR extending in the Y direction may be omitted.

In the second region R2, the support regions SR may be disposed to overlap all the first and second separation regions MS1, MS2a and MS2b to extend in the X direction. The support regions SR may continuously extend between at least some of the second separation regions MS2a and MS2b adjacent in the X direction. In addition, support regions SR extending from the region overlapping second auxiliary separation regions MS2b may be further disposed between the first separation regions MS1 (which overlap the support regions SR) and the second through-wiring region TR2. However, in example embodiments, the arrangement of the support regions SR in the second region R2 may be variously changed.

In some embodiments as shown in FIG. 1, among the first and second separation regions MS1, MS2a and MS2b, the first and second separation regions MS1, MS2a and MS2b that are closest to the first and second through-wiring regions TR1 and TR2 in the Y direction overlap the support regions SR. As such, when the horizontal insulating layer 110 is removed to form the first horizontal conductive layer 102 (e.g., the CSL), the etchant may be prevented from damaging the upper structure and causing defects in the through-contact plugs 170.

The first and second horizontal conductive layers 102 and 104 may include a semiconductor material, and for example, both of the first and second horizontal conductive layers 102 and 104 may include polycrystalline silicon. In this case, at least the first horizontal conductive layer 102 may be a doped layer, and the second horizontal conductive layer 104 may be a doped layer or a layer including impurities diffused from the first horizontal conductive layer 102. However, in example embodiments, the second horizontal conductive layer 104 may be replaced with an insulating layer.

The horizontal insulating layer 110 may be disposed on the second substrate 101, to be in parallel with the first horizontal conductive layer 102, in at least a portion of the second region R2. The horizontal insulating layer 110 may include first to third horizontal insulating layers 111, 112 and 113 sequentially stacked on the second region R2 of the second substrate 101. The horizontal insulating layer 110 may be a layer remaining after being partially replaced with the first horizontal conductive layer 102 in a process of manufacturing the semiconductor device 100.

The horizontal insulating layer 110 may include silicon oxide, silicon nitride, silicon carbide, or silicon oxynitride. In some embodiments, the first and third horizontal insulating layers 111 and 113 and the second horizontal insulating layer 112 may include different insulating materials. In some embodiments, the first and third horizontal insulating layers 111 and 113 may include the same material. For example, the first and third horizontal insulating layers 111 and 113 may be formed of the same material as that of the interlayer insulating layers 120, and the second horizontal insulating layer 112 may be formed of the same material as that of sacrificial insulating layers 118.

The gate electrodes 130 may be vertically spaced apart and stacked on the second substrate 101 to form the stacked structure GS. The gate electrodes 130 may include a lower gate electrode 130L forming a gate of a ground selection transistor, memory gate electrodes 130M forming a plurality of memory cells, and upper gate electrodes 130U forming gates of the string select transistors. The number of memory gate electrodes 130M constituting memory cells may be determined depending on the capacity of the semiconductor device 100. Depending on example embodiments, the upper and lower gate electrodes 130U and 130L may be one or two or more, respectively, and may have the same as or a different structure from the memory gate electrodes 130M. In example embodiments, the gate electrodes 130 may further include a gate electrode 130 disposed on upper portions of the upper gate electrodes 130U and/or on lower portions of the lower gate electrode 130L constituting an erase transistor used in the erase operation using a gate induced drain leakage (GIDL) phenomenon. Further, some of the gate electrodes 130, for example, the memory gate electrodes 130M adjacent to the upper or lower gate electrode 130U and 130L may be dummy gate electrodes.

The gate electrodes 130 are stacked vertically spaced apart from each other on the first region R1, and extend from the first region R1 to the second region R2 at different lengths to form a stepped structure in the form of a step. As illustrated in FIG. 2C, the gate electrodes 130 may form a stepped structure between the gate electrodes 130 in the X direction. In example embodiments, in the case of at least some of the gate electrodes 130, a certain number, for example, two to six gate electrodes 130 may form one gate group, and a stepped structure may be formed between the gate groups in the X direction. In this case, the gate electrodes 130 constituting one gate group may be disposed to have a stepped structure in the Y direction. Due to the stepped structure, the gate electrodes 130 form a step shape in which the lower gate electrode 130 extends further than the upper gate electrode 130 and have ends exposed upward from the interlayer insulating layers 120. In example embodiments, at the ends, the gate electrodes 130 may have an increased thickness.

As illustrated in FIG. 1, the gate electrodes 130 may be disposed to be divided (e.g., into groups) in the Y direction by a first separation region MS1 extending in the X direction. The group of gate electrodes 130 between the pair of first separation regions MS1 may form one memory block, but the range of the memory block is not limited thereto.

Some of the gate electrodes 130, for example, the memory gate electrodes 130M, may form a single layer within one memory block.

The gate electrodes 130 may include a metal material such as tungsten (W). Depending on an example embodiment, the gate electrodes 130 may include polycrystalline silicon or a metal silicide material. In example embodiments, the gate electrodes 130 may further include a diffusion barrier. For example, the diffusion barrier may include tungsten nitride (WN), tantalum nitride (TaN), titanium nitride (TiN) or a combination thereof.

The interlayer insulating layers 120 may be disposed between the gate electrodes 130. Similarly to the gate electrodes 130, the interlayer insulating layers 120 may be disposed to be spaced apart from each other in a direction perpendicular to the upper surface of the second substrate 101, and may extend in the X direction. The interlayer insulating layers 120 may include an insulating material such as silicon oxide or silicon nitride.

The first and second separation regions MS1, MS2a and MS2b may be disposed to penetrate through the gate electrodes 130 in the Z-direction and extend in the X direction. The first and second separation regions MS1, MS2a and MS2b may be disposed parallel to each other. The first and second separation regions MS1, MS2a and MS2b may penetrate through the entire gate electrodes 130 stacked on the second substrate 101 and may be connected to the second substrate 101. The respective first separation regions MS1 extend as one (e.g., continuously) in the X direction, and the respective second separation regions MS2a and MS2b intermittently or discontinuously extend between the pair of first separation regions MS1, or may be disposed only in some areas. For example, second central separation regions MS2a may continuously extend in the X-direction in the first region R1 and may intermittently extend in the X direction in the second region R2. The second auxiliary separation regions MS2b may be disposed only in the second region R2 and may intermittently extend in the X direction. However, in example embodiments, the arrangement order and number of the first and second separation regions MS1, MS2a and MS2b are not limited to those illustrated in FIG. 1.

The first and second separation regions MS1, MS2a and MS2b are not disposed to overlap the first and second through-wiring regions TR1 and TR2, and may be disposed to be spaced apart from the first and second through-wiring regions TR1 and TR2. The first and second separation regions MS1, MS2a and MS2b disposed closest to the first and second through-wiring regions TR1 and TR2 may overlap the support regions SR. In detail, among the first and second separation regions MS1, MS2a and MS2b, a pair of first separation regions MS1 disposed closest to the first through-wiring region TR1 in the Y direction may overlap the support regions SR. Among the first and second separation regions MS1, MS2a and MS2b, a pair of first separation regions MS1 disposed closest to the second through-wiring region TR2 in the Y direction may also overlap the support regions SR. However, according to the arrangement of the first and second separation regions MS1, MS2a and MS2b, the separation region closest to the first and second through-wiring regions TR1 and TR2 may be one of the second separation regions MS2a and MS2b. As illustrated in FIGS. 2A and 2B, the first separation regions MS1 closest to the first and second through-wiring regions TR1 and TR2 may contact the second horizontal conductive layer 104, on both sides of a lower end thereof in the Y direction, and may be spaced apart from the first horizontal conductive layer 102. Also, the first separation regions MS1 may be spaced apart from the horizontal insulating layer 110.

In the first region R1, the first and second separation regions MS1, MS2a and MS2b (except the pair of first separation regions MS1 disposed closest to the first through-wiring regions TR1 in the Y direction) may be spaced apart from the support regions SR so as not to overlap with the support regions SR. For example, as illustrated in FIG. 2A, the second central separation region MS2a adjacent to the first separation region MS1 in the Y direction may be disposed to penetrate through the first horizontal conductive layer 102 at a lower end thereof. A side surface of the first horizontal conductive layer 102 and a side surface of the horizontal insulating layer 110 may contact each other, between the first separation region MS1 and the second central separation region MS2a. For example, in the Y direction, the horizontal insulating layer 110 may be interposed between the first separation region MS1 and the first horizontal conductive layer 102.

As illustrated in FIGS. 2A and 2B, a separation insulating layer 105 may be disposed in the first and second separation regions MS1, MS2a and MS2b. The separation insulating layer 105 may have a shape in which the width decreases toward the second substrate 101 due to a high aspect ratio, but the shape thereof is not limited thereto, and the separation insulating layer 105 may have a side surface perpendicular to the upper surface of the second substrate 101. In example embodiments, a conductive layer may be further disposed in the separation insulating layer 105 in the first and second separation regions MS1, MS2a and MS2b. In this case, the conductive layer may function as a common source line of the semiconductor device 100 or a contact plug connected to the common source line.

As illustrated in FIG. 1, in the first region R1, the upper separation regions SS may extend in the X direction, between the first separation regions MS1 and the second central separation region MS2a and between the second central separation regions MS2a. The upper separation regions SS may be disposed in a region in which the first through-wiring region TR1 is not disposed. The upper separation regions SS may be disposed to penetrate through a portion of the gate electrodes 130 including an uppermost gate electrode 130U among the gate electrodes 130. The upper separation regions SS may divide a total of three gate electrodes 130, including the upper gate electrodes 130U, in the Y direction. However, the number of gate electrodes 130 divided by the upper separation regions SS may be variously changed in example embodiments. The upper gate electrodes 130U divided by the upper separation regions SS may form different string select lines. The upper separation regions SS may include an insulating material. The insulating material may include, for example, silicon oxide, silicon nitride, or silicon oxynitride.

The channel structures CH each form one memory cell string, and may be spaced apart from each other while forming a row and a column on the first region R1. The channel structures CH may be disposed to form a grid pattern or may be disposed in a zigzag shape in or along one or more directions. The channel structures CH have a columnar shape, and may have inclined side surfaces that become narrower as they are closer to the second substrate 101 according to an aspect ratio. In example embodiments, the channel structures CH disposed within a predetermined range from the first through-wiring region TR1 may be dummy channels that do not substantially form a memory cell string.

As illustrated in the enlarged view of FIG. 2A, the channel layer 140 may be disposed in the channel structures CH. In the channel structures CH, the channel layer 140 may be formed in an annular shape surrounding a channel-filled insulating layer 150, but according to an example embodiment, may also have a pillar shape such as a prism or a cylinder without the channel-filled insulating layer 150. A lower portion of the channel layer 140 may be connected to the first horizontal conductive layer 102. The channel layer 140 may include a semiconductor material such as polycrystalline silicon or single crystal silicon.

Channel pads 155 may be disposed on the channel layer 140 in the channel structures CH. The channel pads 155 may be disposed to cover the upper surface of the channel-filled insulating layer 150 and to be electrically connected to the channel layer 140. The channel pads 155 may include, for example, doped polycrystalline silicon.

A gate dielectric layer 145 may be disposed between the gate electrodes 130 and the channel layer 140. Although not specifically illustrated, the gate dielectric layer 145 may include a tunneling layer, a charge storage layer, and a blocking layer sequentially stacked from the channel layer 140. The tunneling layer may tunnel charge to the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide (Sift), silicon nitride ($Si_3N_4$), silicon oxynitride (SiON), a high-k dielectric material, or a combination thereof. In example embodiments, at least a portion of the gate dielectric layer 145 may extend in a horizontal direction along the gate electrodes 130.

The dummy channel structures DCH have the same or similar structure as the channel structures CH, and may be disposed to be spaced apart from each other while forming rows and columns in a portion of the first region R1, and in the second region R2. The dummy channel structures DCH may not be electrically connected to the upper wiring structures, or may not form a memory cell string in the semiconductor device 100, unlike the channel structures CH. In the first region R1, the dummy channel structures DCH may be disposed in a region adjacent to the first through-wiring region TR1 and a region adjacent to the second region R2.

As illustrated in FIGS. 2A and 2B, dummy channel structures DCH disposed adjacent to the first and second through-wiring regions TR1 and TR2 may be disposed to penetrate through the horizontal insulating layer 110 in the Z direction. The dummy channel structures DCH may have a lower portion surrounded by the second horizontal conductive layer 104 and the horizontal insulating layer 110, and may be spaced apart from the first horizontal conductive layer 102. In detail, dummy channel structures DCH closest to the first and second through-wiring regions TR1 and TR2, for example, first dummy channel structures, may penetrate through the interlayer insulating layers 120 and the sacrificial insulating layers 118, and lower ends thereof may penetrate through the second horizontal conductive layer 104 and the horizontal insulating layer 110.

Dummy channel structures DCH disposed adjacent to the first and second through-wiring regions TR1 and TR2 after the first dummy channel structure, for example, second dummy channel structures, may penetrate through the interlayer insulating layers 120 and the gate electrodes 130, and lower ends thereof may penetrate through the second horizontal conductive layer 104 and the horizontal insulating layer 110. The second dummy channel structure may be disposed within a first distance D1 in the Y direction from the first separation regions MS1 closest to the first and second through-wiring regions TR1 and TR2. The first distance D1 may range from about 400 micrometers (μm) to about 500 μm, for example. In FIG. 2A, the channel structures CH disposed between the second central separation region MS2a and the dummy channel structures DCH may functionally be dummy channel structures, and may be referred to as a third dummy channel structures. In this case, the third dummy channel structures may have a structure in which the channel layers 140 are in contact with the first horizontal conductive layer 102, similar to the channel structures CH.

The first and second through-wiring regions TR1 and TR2 may be regions including a wiring structure for electrically connecting the memory cell structure CELL and the peripheral circuit structure PERI to each other. The first through-wiring region TR1 may be disposed to penetrate through the first region R1, and the second through-wiring region TR2 may be disposed to penetrate through the second region R2. The first and second through-wiring regions TR1 and TR2 may include through-contact plugs 170 penetrating through the second substrate 101 and extending in the Z direction, and an insulating region IR surrounding the through-contact plugs 170. In the case of the first through-wiring region TR1, each of the first through-wiring regions TR1 may be disposed or provided for a plurality of memory blocks, and in the case of the second through-wiring region TR2, one second through-wiring region TR2 may be disposed or provided for each memory block, for example. However, the number, size, arrangement shape, and shape of the first and second through-wiring regions TR1 and TR2 may be variously changed in example embodiments. For example, in some embodiments, also in the case of the second through-wiring region TR2, one may be disposed or provided for the plurality of memory blocks in the Y direction.

The first and second through-wiring regions TR1 and TR2 may be disposed to be spaced apart from the first and second separation regions MS1, MS2a and MS2b, as illustrated in FIG. 1. For example, the first and second through-wiring regions TR1 and TR2 are spaced apart from the first separation regions MS1 adjacent to each other in the Y direction and may be disposed in the center of the pair of first separation regions MS1. By this arrangement, the sacrificial insulating layers 118 may remain in the first and second through-wiring regions TR1 and TR2.

The insulating region IR may penetrate through the memory cell structure CELL and may be disposed in parallel with the second substrate 101 and the gate electrodes 130. The insulating region IR may include an insulating stacked structure formed of an insulating material, as a region in which the gate electrodes 130 do not extend or are not disposed. The insulating region IR may include a substrate insulating layer 160, which is a first or initial insulating layer disposed parallel to the second substrate 101 and disposed at the same height level as the second substrate 101, and interlayer insulating layers 120 and sacrificial insulating layers 118 which are second and third insulating layers that are alternately stacked on un upper surface of the substrate insulating layer 160.

The substrate insulating layer 160, which is the first or initial insulating layer, is disposed in a region from which the second substrate 101, the horizontal insulating layer 110 and the second horizontal conductive layer 104 have been partially removed, and may be disposed to be surrounded by the second substrate 101, the horizontal insulating layer 110, and the second horizontal conductive layer 104. The lower surface of the substrate insulating layer 160 may be coplanar with the lower surface of the second substrate 101 or may be positioned on a lower level than the lower surface of the second substrate 101 (e.g., relative to the first substrate 201). In example embodiments, the substrate insulating layer 160 may include a plurality of insulating layers. Since the second insulating layer is formed by extending the interlayer insulating layers 120, the second insulating layer may be positioned at substantially the same height level as the interlayer insulating layers 120. The third insulating layer may include the sacrificial insulating layers 118 and may be positioned at substantially the same height level as the gate electrodes 130. When the first and second through-wiring regions TR1 and TR2 are defined with respect to the substrate insulating layer 160 region, the sacrificial insulating layers 118 may be partially extended outwardly of the first and second through-wiring regions TR1 and TR2.

The substrate insulating layer 160, the interlayer insulating layers 120, and the sacrificial insulating layers 118 forming the insulating region IR may be formed of insulating materials. For example, the substrate insulating layer 160, the interlayer insulating layers 120, and the sacrificial insulating layers 118 may each include silicon oxide, silicon nitride, or silicon oxynitride. The substrate insulating layer 160 and the sacrificial insulating layers 118 may have different widths or may have the same width according to example embodiments.

The through-contact plugs 170 extend vertically to the upper surface of the second substrate 101 by penetrating through the entire insulating region IR vertically, and may electrically connect elements of the memory cell structure CELL and circuit elements 220 of the peripheral circuit structure PERI. For example, the through-contact plugs 170 may electrically connect the gate electrodes 130 or the channel structures CH of the memory cell structure CELL to the circuit elements 220 of the peripheral circuit structure PERI. Upper portions of the through-contact plugs 170 may be connected to the wiring lines 180 as an upper wiring structure, but may also be connected to separate contact plugs according to example embodiments. Lower portions of the through-contact plugs 170 may be connected to the circuit wiring lines 280 that are lower wiring structures.

The through-contact plugs 170 may penetrate through the interlayer insulating layers 120 and the sacrificial insulating layers 118 of the insulating region IR, and lower portions thereof may penetrate through the substrate insulating layer 160. The number, and shape of the through-contact plugs 170 in each of first and second through-wiring regions TR1 and TR2 may be variously changed in example embodiments. According to example embodiments, the through-contact plugs 170 may have a form in which a plurality of layers are connected. In addition, in addition to the through-contact plugs 170, wiring structures in the form of wiring lines may be further disposed in the insulating region IR according to example embodiments. The through-contact plugs 170 may include a conductive material, for example, tungsten (W), copper (Cu), aluminum (Al), or the like.

As illustrated in FIG. 1, gate contact plugs 175 may be connected to gate electrodes 130 of which upper surfaces are exposed upwardly, among the gate electrodes 130 in the second region R2.

The wiring lines 180 may form an upper wiring structure electrically connected to the memory cells in the memory cell structure CELL. The wiring lines 180 may be electrically connected to, for example, the gate electrodes 130 or the channel structures CH. The number of contact plugs and wiring lines constituting the wiring structure may be variously changed in example embodiments. The wiring lines 180 may include metal, and may include, for example, tungsten (W), copper (Cu), aluminum (Al), or the like.

The cell region insulating layer 190 may be disposed to cover the second substrate 101, the gate electrodes 130 on the second substrate 101, and the peripheral region insulating layer 290. The cell region insulating layer 190 may be formed of an insulating material.

Figure 3:
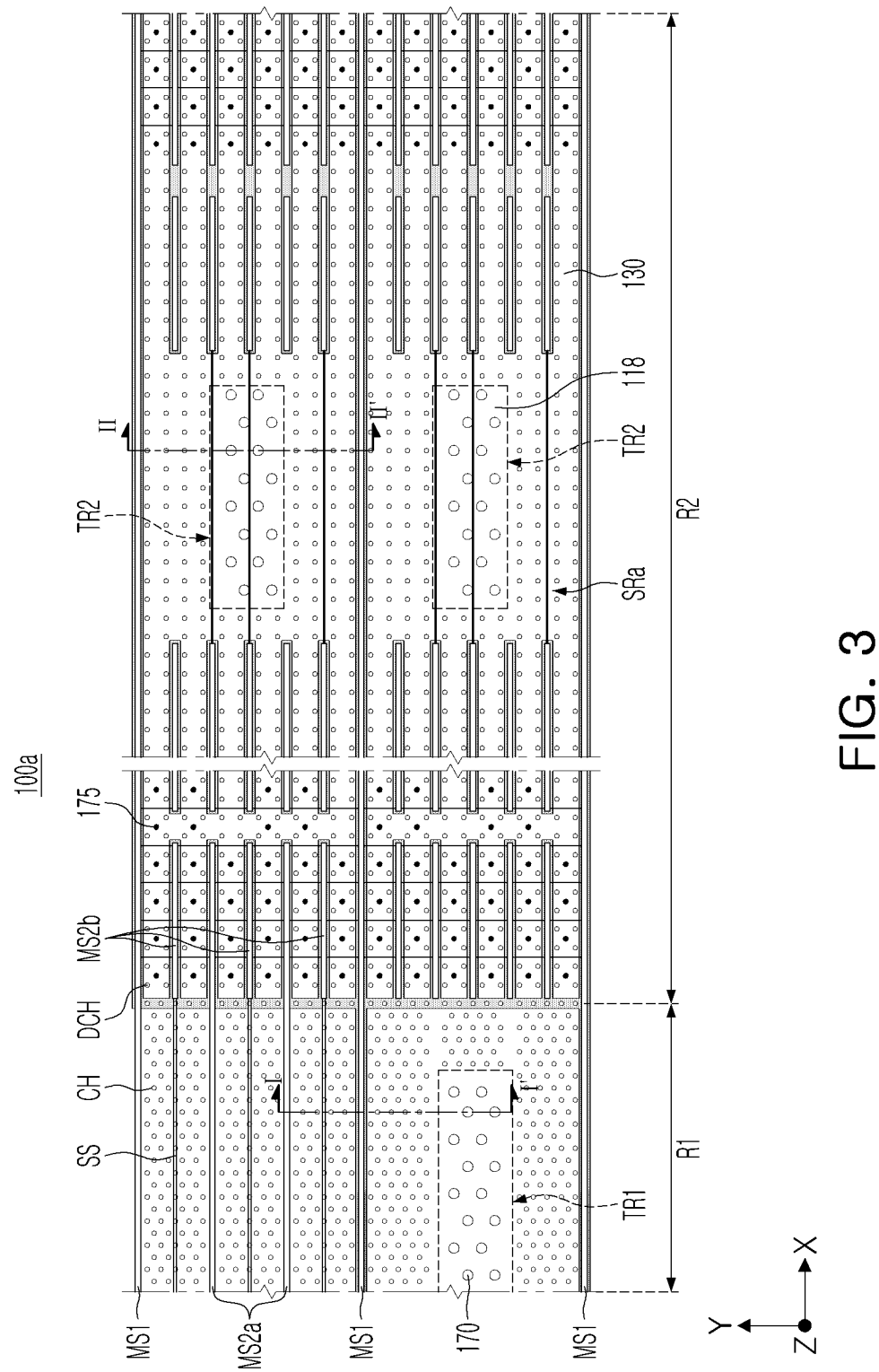
FIG. 3 is a schematic plan view of a semiconductor device according to example embodiments.

FIG. 3 is a schematic plan view of a semiconductor device according to example embodiments.

Figure 4A:
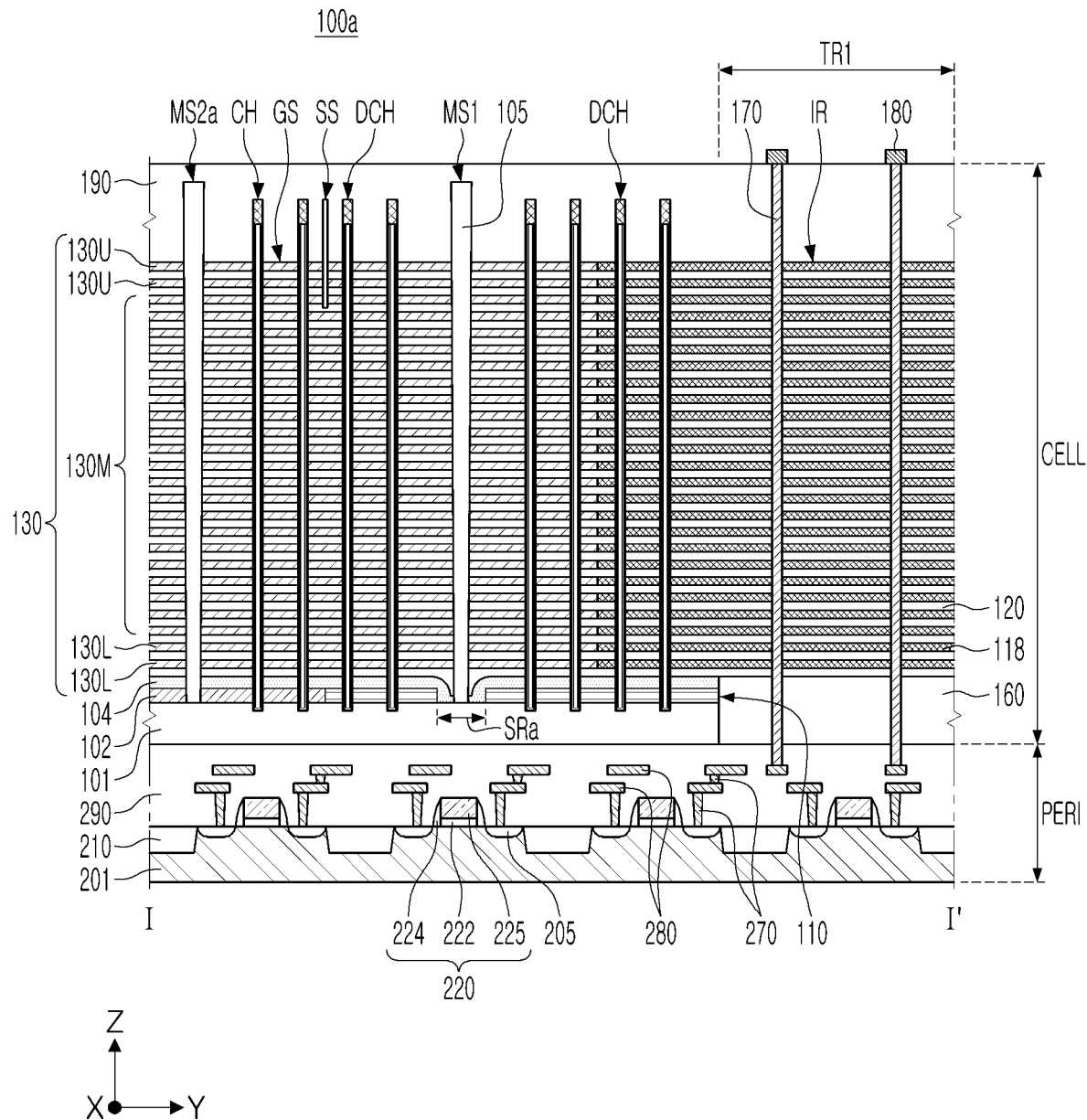
FIGS. 4A and 4B are schematic cross-sectional views of a semiconductor device according to example embodiments.
Figure 4B:
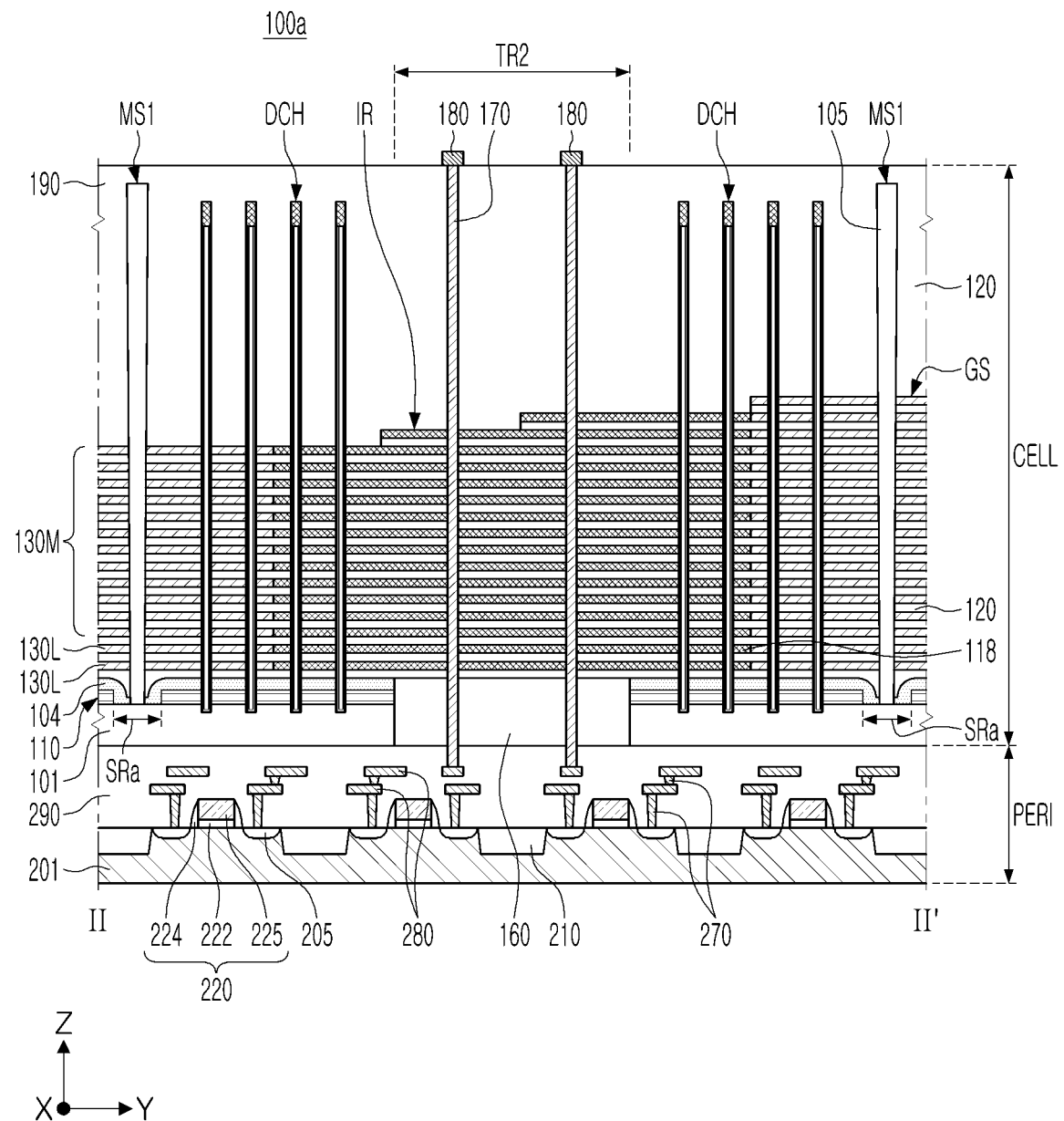

FIGS. 4A and 4B are schematic cross-sectional views of a semiconductor device according to example embodiments. FIGS. 4A and 4B are cross-sectional views taken along lines I-I' and of FIG. 3, respectively.

Referring to FIGS. 3 to 4B, in a semiconductor device 100a, the arrangement of support regions SRa, which are regions in which a second horizontal conductive layer 104 directly contacts a second substrate 101, may be different from the embodiment illustrated in FIGS. 1 to 2C. In detail, the support regions SRa disposed closest to the first and second through-wiring regions TR1 and TR2 may be support regions SRa overlapping the first separation regions MS1. In contrast with the embodiment of FIGS. 1 to 2C, the support region SRa may not be disposed between the first separation regions MS1 closest to the first and second through-wiring regions TR1 and TR2 in the Y direction and the first and second through-wiring regions TR1 and TR2. Accordingly, as illustrated in FIGS. 4A and 4B, the support regions SRa may not be disposed below the ends of the sacrificial insulating layers 118 constituting the first and second through-wiring regions TR1 and TR2.

As described above, in example embodiments, the arrangement of the support regions SRa that do not overlap with the first and second separation regions MS1, MS2a and MS2b and are independently disposed may be variously changed. In other words, the present invention may include various combinations of overlapping and non-overlapping support regions SR and separation regions MS1, MS2a, MS2b in accordance with the embodiments described herein.

Figure 5A:
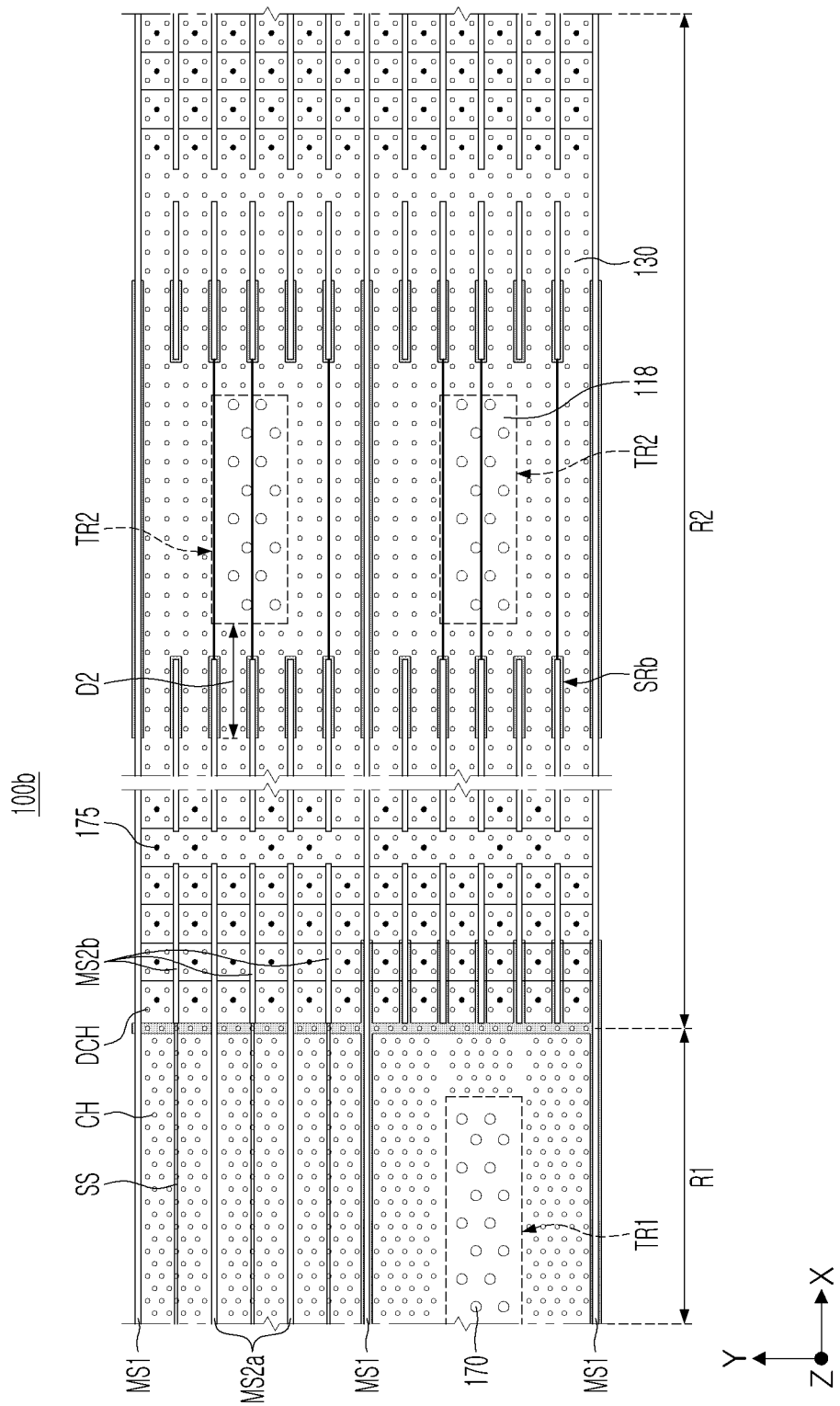
FIGS. 5A and 5B are plan views of semiconductor devices according to example embodiments.
Figure 5B:
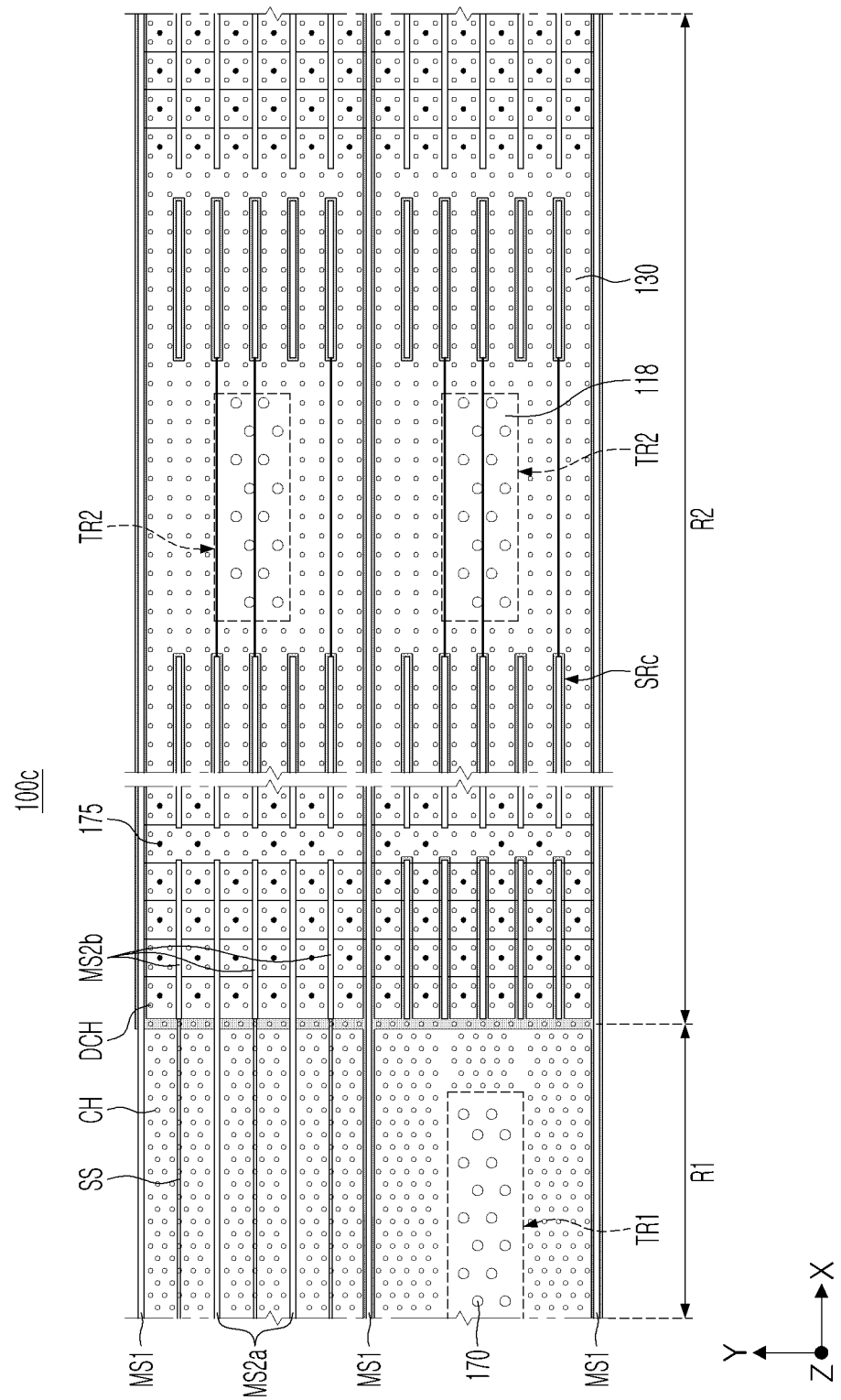

FIGS. 5A and 5B are plan views of semiconductor devices according to example embodiments.

Referring to FIG. 5A, in a semiconductor device 100b, the arrangement of support regions SRb, which are regions in which a second horizontal conductive layer 104 directly contacts a second substrate 101, may be different from the example embodiment of FIGS. 1 to 4B. In detail, in the second region R2, the support regions SRb are not disposed to overlap all of the first and second separation regions MS1, MS2a and MS2b, but may be disposed to overlap the first and second separation regions MS1, MS2a and MS2b only in a predetermined area around the first and second through-wiring areas TR1 and TR2. For example, in the box area of or otherwise within a second distance D2 in the X direction and Y direction from the second through-wiring region TR2, portions of the first and second separation regions MS1, MS2a and MS2b may overlap the support regions SRb, while portions of the first and second separation regions MS1, MS2a and MS2b beyond the second distance D2 may not overlap or may be free of the support regions SRb. In the periphery of the first through-wiring region TR1, portions of the first separation regions MS1 adjacent in the Y direction and the second separation regions MS2a and MS2b adjacent in the X direction may also overlap the support regions SRb, while portions of the first and second separation regions MS1, MS2a and MS2b beyond the periphery of the first through-wiring region TR1 may not overlap or may be free of the support regions SRb.

In example embodiments, only one group, among the first and second separation regions MS1, MS2a and MS2b adjacent to the first and second through-wiring regions TR1 and TR2 in the X direction and the first and second separation regions MS1, MS2a and MS2b adjacent in the Y direction, may overlap the support regions SRb. In this case, portions of the first and second separation regions MS1, MS2a and MS2b that do not overlap the support regions SRb may be disposed to be spaced apart from the first and second through-wiring regions TR1 and TR2, by a predetermined distance, for example, about 600 μm or more. In addition, in example embodiments, the support region SRb disposed to extend in the Y direction, between the first region R1 and the second region R2, may be omitted.

Referring to FIG. 5B, in a semiconductor device 100c, similar to the embodiment of FIG. 5A, in the second region R2, support regions SRc may only be disposed to overlap the first and second separation regions MS1, MS2a and MS2b adjacent to the first and second through-wiring regions TR1 and TR2. However, in contrast with the embodiment of FIG. 5A, the support regions SRc may extend to the other ends in the extension directions of the first and second separation regions MS1, MS2a and MS2b.

In example embodiments, the support regions SRc may only be disposed to overlap the second separation regions MS2a and MS2b adjacent to the first and second through-wiring regions TR1 and TR2 in the X direction, or may be disposed to overlap only the first separation regions MS1 adjacent in the Y direction. In addition, in example embodiments, the support region SRc disposed to extend in the Y direction, between the first region R1 and the second region R2, may be omitted.

Figure 6:
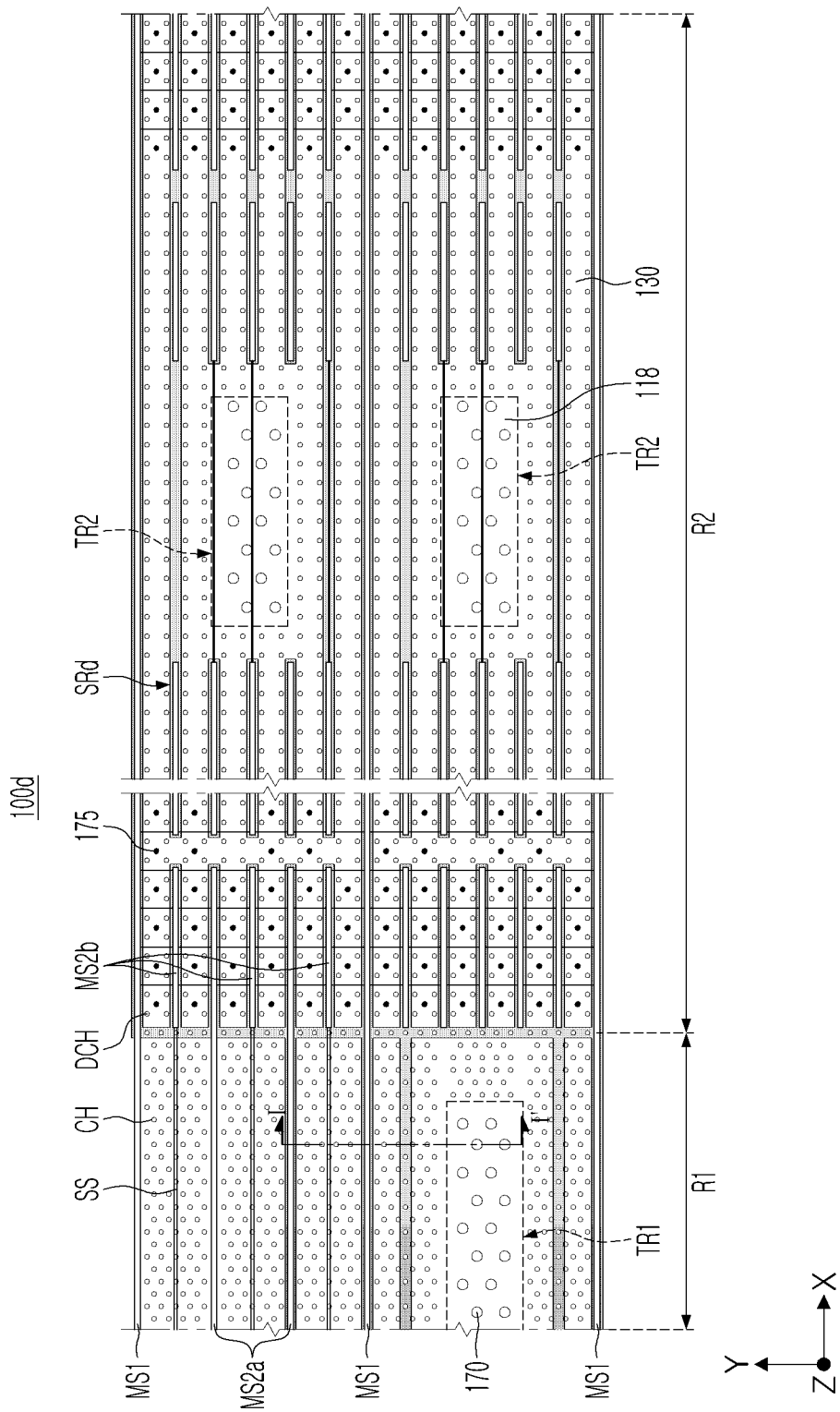
FIG. 6 is a plan view of a semiconductor device according to example embodiments.

FIG. 6 is a plan view of a semiconductor device according to example embodiments.

Figure 7:
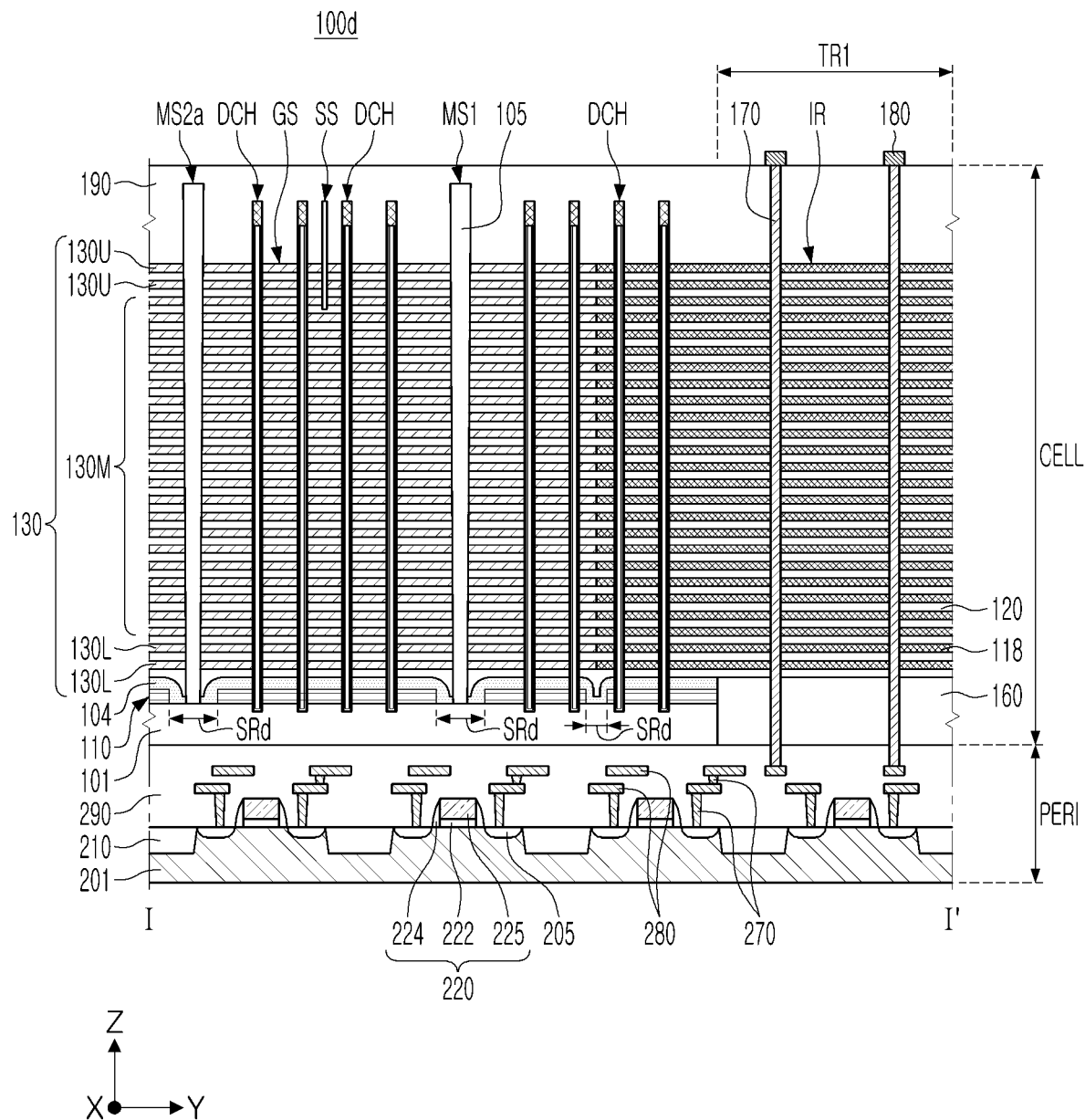
FIG. 7 is a cross-sectional view of a semiconductor device according to example embodiments.

FIG. 7 is a cross-sectional view of a semiconductor device according to example embodiments. In FIG. 7, a cross-section taken along line I-I' of FIG. 6 is illustrated.

Referring to FIGS. 6 and 7, in a semiconductor device 100d, the arrangement of support regions SRd, which are regions in which the second horizontal conductive layer 104 directly contacts the second substrate 101, may be different from the embodiment illustrated in FIGS. 1 to 4B. In detail, in the first region R1, two first and second separation regions MS1 and MS2a adjacent to the first through-wiring region TR1 in the Y direction may overlap the support regions SRd. For example, not only the first separation regions MS1 closest to the first through-wiring region TR1 in the Y direction, but also the second central separation region MS2a adjacent subsequently may be disposed to overlap the support regions SRd. In this case, as illustrated in FIG. 7, the channel structures adjacent to the second central separation regions MS2a overlapping the support regions SRd may be dummy channel structures DCH of which lower portions penetrate through the horizontal insulating layer 110.

As described above, in example embodiments, in the case of the first and second separation regions MS1, MS2a and MS2b adjacent to the first and second through-wiring regions TR1 and TR2, a plurality of first and second separation regions may be disposed to overlap the support regions SRd.

Figure 8:
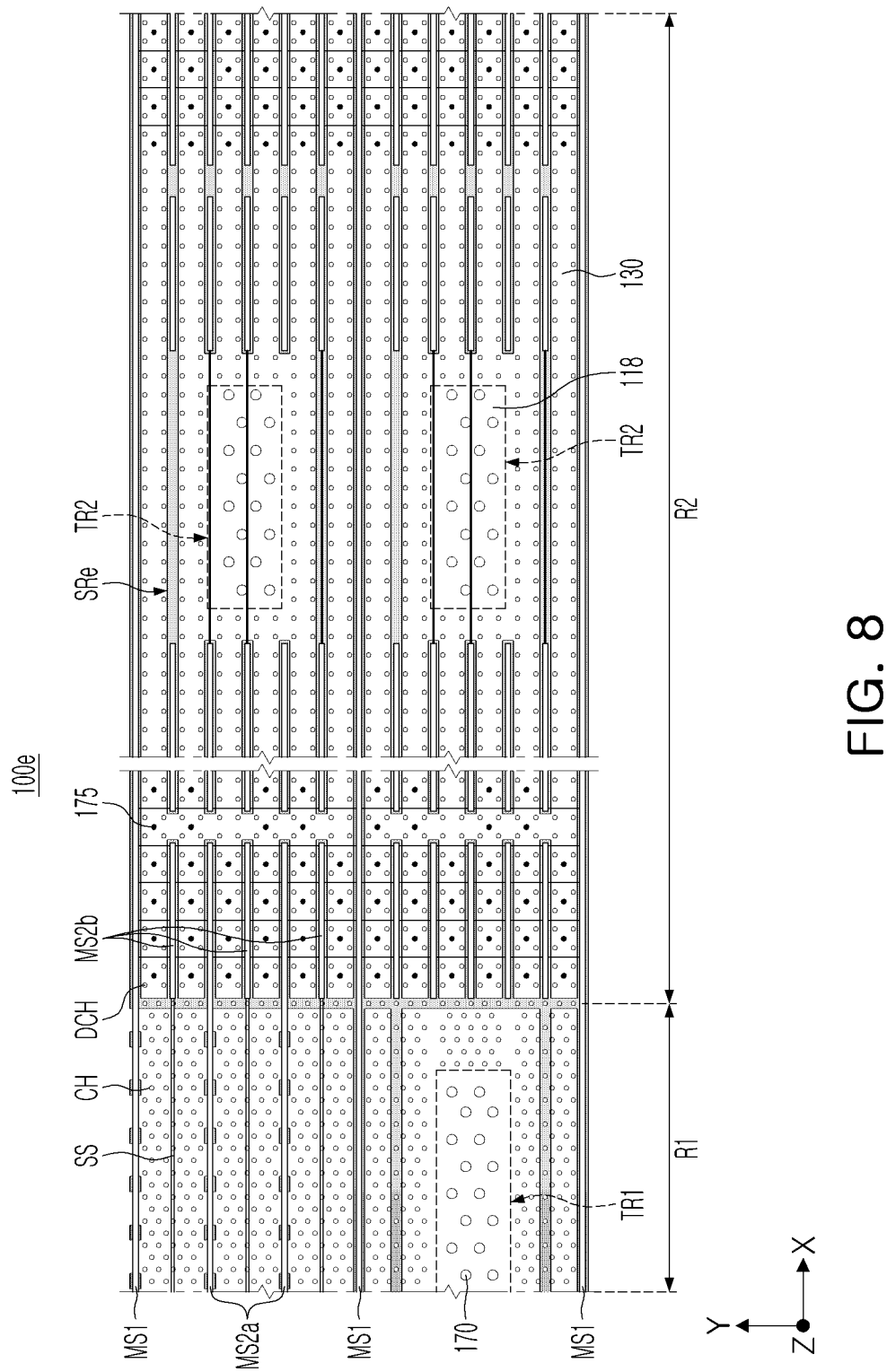
FIG. 8 is a plan view of a semiconductor device according to example embodiments.

FIG. 8 is a plan view of a semiconductor device according to example embodiments.

Referring to FIG. 8, in a semiconductor device 100e, the arrangement of support regions SRe, which are regions in which the second horizontal conductive layer 104 directly contacts the second substrate 101, may be different from the example embodiment illustrated in FIGS. 1 to 4B. In detail, in the first region R1, the support regions SRe may be disposed to overlap not only the first separation regions MS1 adjacent to the first through-wiring region TR1 in the Y direction but also the first and second separation regions MS1 and MS2a spaced apart from the first through-wiring region TR1. For example, the support regions SRe may be intermittently disposed in an island shape along the first and second separation regions MS1 and MS2a spaced apart from the first through-wiring region TR1.

Figure 9:
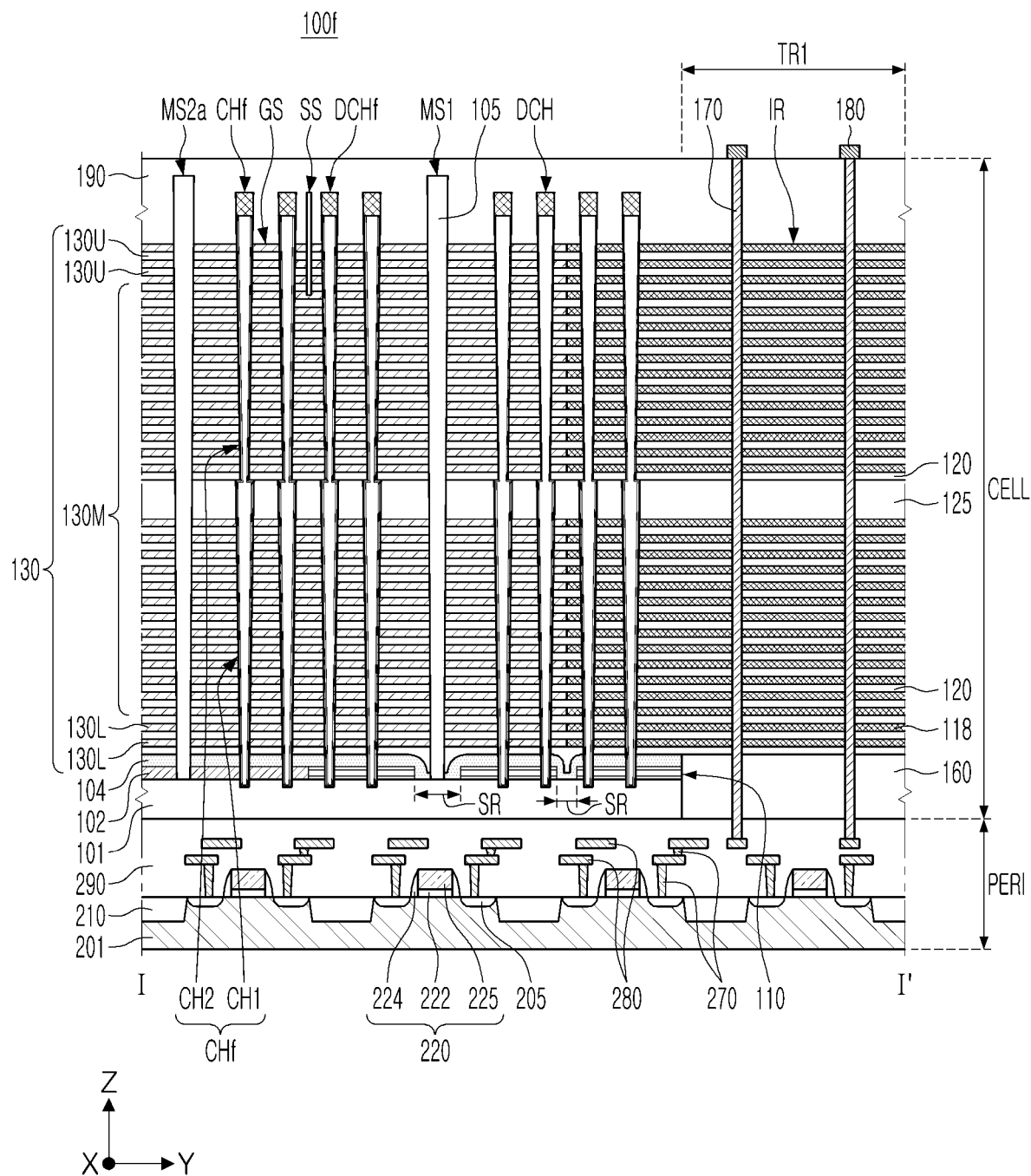
FIG. 9 is a cross-sectional view of a semiconductor device according to example embodiments.

FIG. 9 is a cross-sectional view of a semiconductor device according to example embodiments.

Referring to FIG. 9, in a semiconductor device 100f, a first stacked structure of gate electrodes 130 is comprised of vertically stacked lower and upper stacked structures, and channel structures CHf may include vertically stacked first and second channel structures CH1 and CH2. Dummy channel structures DCHf may also be disposed in the same shape as the channel structures CHf. The structure of the channel structures CHf as described above may be introduced to stably form the channel structures CHf when the number of the gate electrodes 130 stacked is relatively great or large in number.

The channel structures CHf may have a form in which the lower first channel structures CH1 and the upper second channel structures CH2 are connected, and may have a bent or stepped portion due to a difference in width in the connection region. A channel layer 140, a gate dielectric layer 145, and a channel-filled insulating layer 150 may be connected to each other between the first channel structure CH1 and the second channel structure CH2. A channel pad 155 may be disposed only on an upper end of the upper second channel structure CH2. However, in example embodiments, the first channel structure CH1 and the second channel structure CH2 may each include the channel pad 155, and in this case, the channel pad 155 of the first channel structure CH1 may be connected to the channel layer 140 of the second channel structure CH2. An upper interlayer insulating layer 125 having a relatively thick thickness may be disposed on an uppermost portion of the lower stacked structure. However, the shapes of an interlayer insulating layers 120 and the upper interlayer insulating layer 125 may be variously changed in example embodiments.

FIGS. 10A to 10I are schematic cross-sectional views illustrating a method of manufacturing a semiconductor device according to example embodiments. In FIGS. 10A to 10I, areas corresponding to the area and cross section shown in FIG. 2A are illustrated.

Figure 10A:
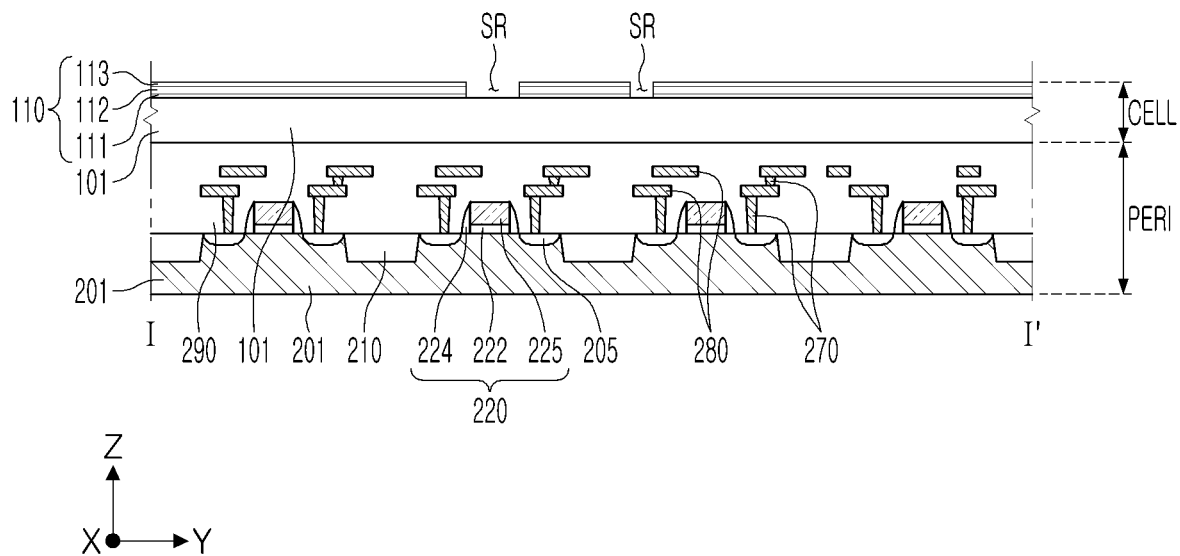
FIGS. 10A to 10I are schematic cross-sectional views illustrating a method of manufacturing a semiconductor device according to example embodiments.

Referring to FIG. 10A, a peripheral circuit structure PERI including circuit elements 220 and lower wiring structures is formed on a first substrate 201, and a second substrate 101 provided with a memory cell structure CELL is formed on the peripheral circuit structure PERI, and a horizontal insulating layer 110 may be formed.

In detail, device isolation layers 210 may be formed in the first substrate 201, and a circuit gate dielectric layer 222 and a circuit gate electrode 225 may be sequentially formed on the first substrate 201. The device isolation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of polysilicon and/or metal silicide layers, but the configuration is not limited thereto. A spacer layer 224 and source/drain regions 205 may be formed on both or opposing sidewalls of the circuit gate dielectric layer 222 and the circuit gate electrode 225. According to example embodiments, the spacer layer 224 may be formed of a plurality of layers. An ion implantation process may be performed to form the source/drain regions 205.

Among the lower wiring structures, the circuit contact plugs 270 may be formed by partially forming the peripheral region insulating layer 290, then removing a portion thereof by etching, and filling the removed portion with a conductive material. The circuit wiring lines 280 may be formed, for example, by depositing a conductive material and then patterning the conductive material.

The peripheral region insulating layer 290 may be formed of a plurality of insulating layers. The peripheral region insulating layer 290 may be formed by partial formation thereof in one or more steps of forming the lower wiring structures and partially formed on an uppermost circuit wiring line 280, to cover the circuit elements 220 and the lower wiring structures.

The second substrate 101 may be formed on the peripheral region insulating layer 290. The second substrate 101 may be formed of, for example, polycrystalline silicon, and may be formed by a CVD process. Polycrystalline silicon forming the second substrate 101 may include impurities.

The first to third horizontal insulating layers 111, 112 and 113 constituting the horizontal insulating layer 110 may be sequentially stacked on the second substrate 101. The horizontal insulating layer 110 may be partially replaced with the first horizontal conductive layer 102 of FIG. 2A through a subsequent process. The first and third horizontal insulating layers 111 and 113 may include a material different from the second horizontal insulating layer 112. For example, the first and third horizontal insulating layers 111 and 113 may be formed of the same material as the interlayer insulating layers 120, and the second horizontal insulating layer 112 may be formed of the same material as the sacrificial insulating layers 118.

The first to third horizontal insulating layers 111, 112 and 113 may be removed from the support regions SR by a patterning process. Accordingly, the horizontal insulating layer 110 is formed only in a region excluding the support regions SR, and the second substrate 101 may be exposed in the support regions SR. That is, the support regions SR may include portions of the second substrate 101 that are free of the horizontal insulating layer 110.

Figure 10B:
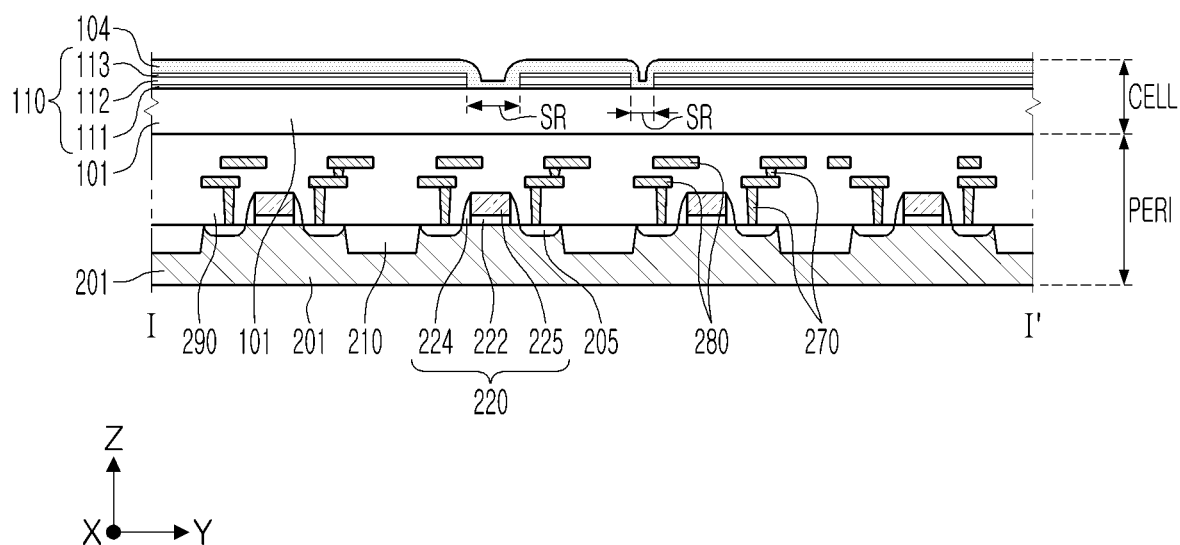

Referring to FIG. 10B, a second horizontal conductive layer 104 may be formed on the horizontal insulating layer 110.

The second horizontal conductive layer 104 is formed on the horizontal insulating layer 110 and may be in contact with the second substrate 101 in the support regions SR. Accordingly, the second horizontal conductive layer 104 may be bent or conformal along the ends of the horizontal insulating layer 110, so as to cover the ends and extend onto the portions of the second substrate 101. That is, the support regions SR may include regions where the second horizontal conductive layer 104 directly contacts portions of the second substrate 101.

Figure 10C:
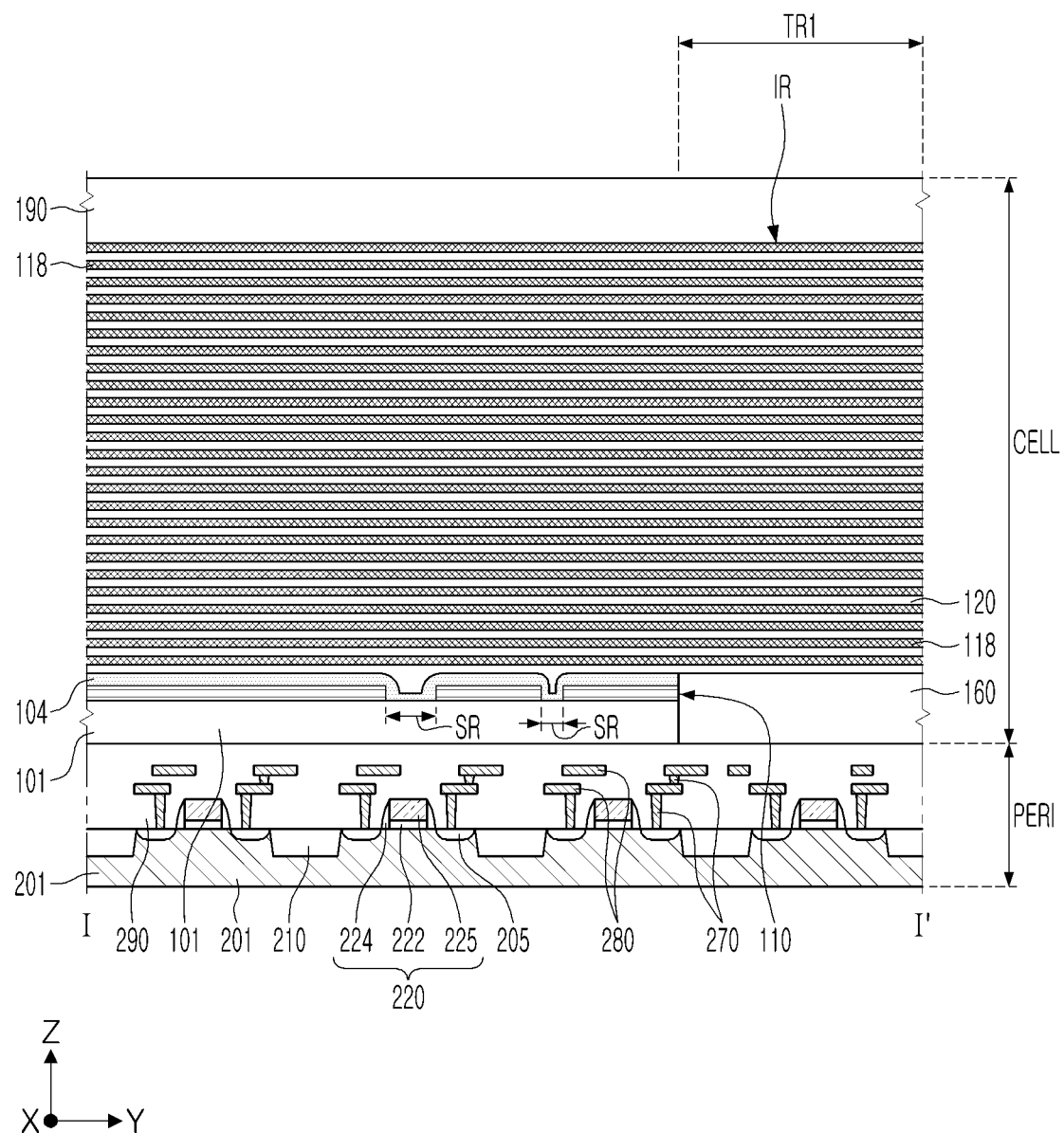

Referring to FIG. 10C, a substrate insulating layer 160 penetrating through the second substrate 101 may be formed, and sacrificial insulating layers 118 and interlayer insulating layers 120 may be alternately stacked thereon.

The substrate insulating layer 160 may be formed by partially removing the second substrate 101, the horizontal insulating layer 110, and the second horizontal conductive layer 104 in regions corresponding to the first and second through-wiring regions TR1 and TR2 and then filling with an insulating material. The substrate insulating layer 160 may be formed over the entire area of the first and second through-wiring regions TR1 and TR2, or may be formed to be smaller than the entire area. After the filling with the insulating material, a planarization process may be further performed using a chemical mechanical polishing (CMP) process. Accordingly, the upper surface of the substrate insulating layer 160 may be substantially coplanar with the upper surface of the second horizontal conductive layer 104.

The sacrificial insulating layers 118 that are partially replaced with gate electrodes 130 (see FIG. 2A) through a subsequent process may be formed. The sacrificial insulating layers 118 may be formed of a material different from the interlayer insulating layers 120, and may be formed of a material capable of being etched with etch selectivity for the interlayer insulating layers 120 under specific etching conditions. For example, the interlayer insulating layer 120 may be formed of silicon oxide and/or silicon nitride, and the sacrificial insulating layers 118 may be formed of silicon, silicon oxide, silicon carbide, and/or silicon nitride, which is selected to be different from the material of the interlayer insulating layer 120. In example embodiments, thicknesses of the interlayer insulating layers 120 may not all the same as each other. The thickness of the interlayer insulating layers 120 and the sacrificial insulating layers 118 and the number of configured layers thereof may be variously changed from those illustrated. As a result, the insulating region IR of the first and second through-wiring regions TR1 and TR2 may be formed.

A cell region insulating layer 190 covering an upper portion of the stacked structure of the sacrificial insulating layers 118 and the interlayer insulating layers 120 may be formed.

Figure 10D:
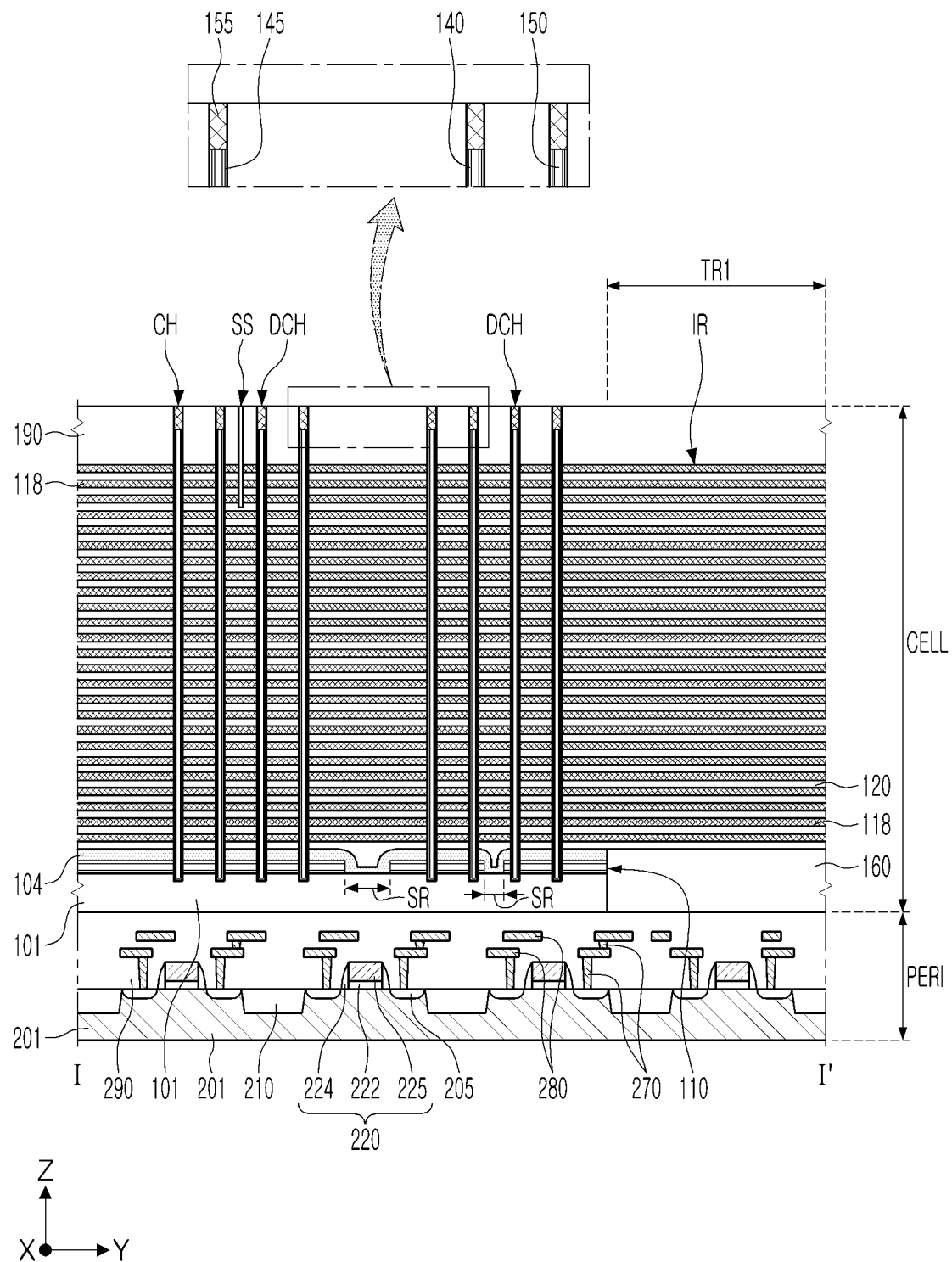

Referring to FIG. 10D, channel structures CH and dummy channel structures DCH penetrating through the stacked structure of the sacrificial insulating layers 118 and the interlayer insulating layers 120 may be formed.

In detail, the upper separation region SS may be formed by partially removing the sacrificial insulating layers 118 and the interlayer insulating layers 120. The upper separation region SS may be formed by exposing a region in which the upper separation region SS is to be formed using a separate mask layer, by removing a predetermined number of sacrificial insulating layers 118 and interlayer insulating layers 120 from an uppermost portion thereof, and then by depositing an insulating material. The upper separation region SS may further extend downwardly in the Z direction than the region in which the upper gate electrodes 130U of FIG. 1 are formed.

The channel structures CH and the dummy channel structures DCH may be formed by anisotropically etching the sacrificial insulating layers 118, the interlayer insulating layers 120, and the horizontal insulating layer 110, by forming hole-shaped channel holes and then filling the holes. In example embodiments, the dummy channel structures DCH may be formed to have a size larger than that of the channel structures CH. Due to or depending on the height of the stacked structure, sidewalls of the channel holes may not be perpendicular to the upper surface of the second substrate 101. The channel holes may be formed to recess a portion of the second substrate 101.

At least a portion of a gate dielectric layer 145, the channel layer 140, the channel-filled insulating layer 150, and the channel pad 155 are sequentially formed in each of the channel holes, thereby forming the channel structures CH and the dummy channel structures DCH. The gate dielectric layer 145 may be formed to have a uniform thickness using an ALD or CVD process. In this step, all or part of the gate dielectric layer 145 may be formed, and a portion thereof extending perpendicular to the second substrate 101 along the channel holes may be formed. The channel layer 140 may be formed on the gate dielectric layer 145 in the channel holes. The channel-filled insulating layer 150 is formed to fill the channel holes, and may be an insulating material. However, according to example embodiments, the channel layers 140 may be filled with a conductive material other than the channel-filled insulating layer 150. The channel pad 155 may be formed of a conductive material, for example, polycrystalline silicon.

Figure 10E:
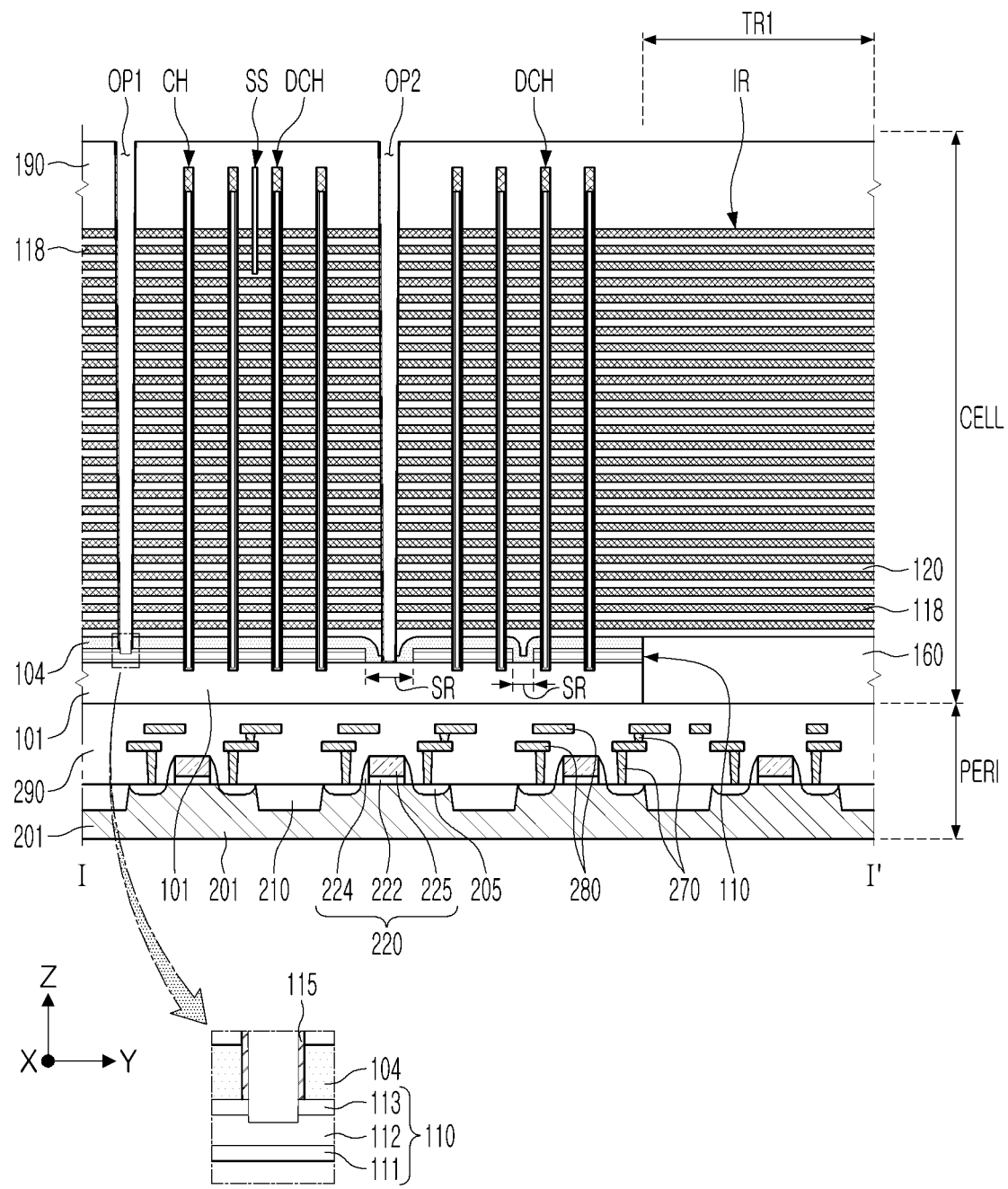

Referring to FIG. 10E, openings OP1 and OP2 penetrating through the stacked structure of the sacrificial insulating layers 118 and the interlayer insulating layers 120 are formed, and sacrificial spacers 115 may be formed on inner sidewalls of the openings OP1 and OP2.

Before the openings OP are formed, the cell region insulating layer 190 may be further formed on the channel structures CH and the dummy channel structures DCH. The openings OP1 and OP2 may be formed in positions of the first and second separation regions MS1, MS2a and MS2b of FIG. 1. The openings OP1 and OP2 may be formed by forming a mask layer using a photolithography process and anisotropic etching the stacked structure. The openings OP1 and OP2 may be formed in a trench shape extending in the X direction.

The sacrificial spacers 115 may be formed on inner sidewalls of the openings OP1 and OP2. The sacrificial spacers 115 may include a material having etch selectivity with respect to the sacrificial insulating layers 118, the interlayer insulating layers 120, and the horizontal insulating layer 110. For example, the sacrificial spacers 115 may include polycrystalline silicon.

The first opening OP1 overlapping the horizontal insulating layer 110 is formed such that the upper surface of the horizontal insulating layer 110 is exposed, and the lower end of the first opening OP1 extends when the sacrificial spacers 115 are formed in such a manner that the second horizontal insulating layer 112 is exposed at the lower end of the first opening OP1. The second opening OP2 overlapping the support region SR may be formed such that a lower end thereof penetrates through the second horizontal conductive layer 104 and a surface of the second substrate 101 is exposed.

Figure 10F:
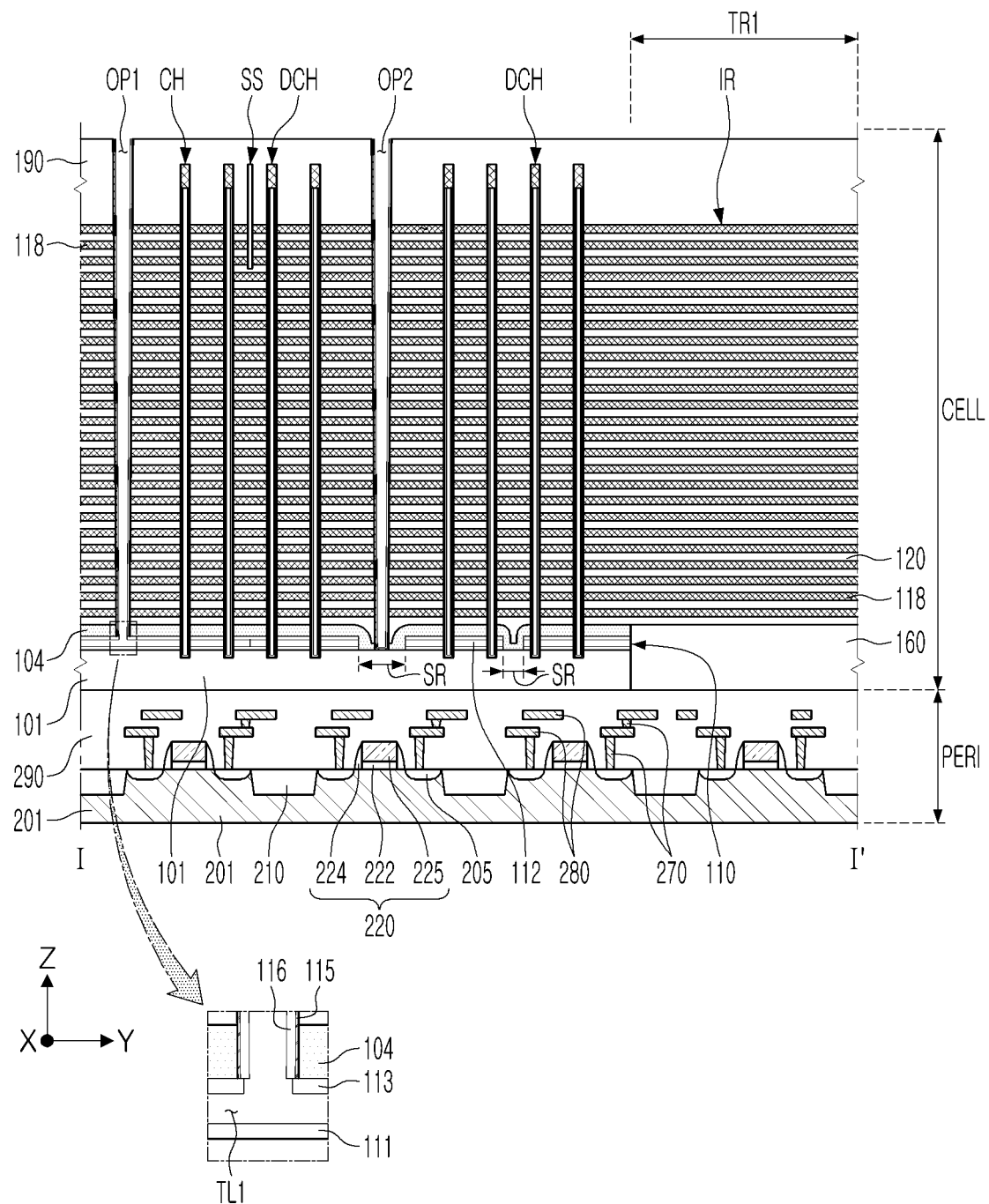

Referring to FIG. 10F, after partially oxidizing the sacrificial spacers 115 to form sacrificial oxide layers 116, the second horizontal insulating layer 112 may be removed to form a first tunnel portion TL1.

The sacrificial oxide layers 116 may be formed by partially oxidizing the sacrificial spacers 115. According to example embodiments, before the sacrificial oxide layer 116 is formed, a wet etching process of partially removing the first and third horizontal insulating layers 111 and 113 from a lower portion of the first opening OP1 may be further performed. In this case, portions of the second horizontal conductive layer 104 and the second substrate 101 exposed after the first and third horizontal insulating layers 111 and 113 are partially removed may also be oxidized together in a process of forming the sacrificial oxide layer 116.

The first tunnel portion TL1 may be formed by selectively removing the second horizontal insulating layer 112 exposed through the first opening OP1. The removal processes may be performed by, for example, a wet etching process.

An opening adjacent to the first and second through-wiring regions TR1 and TR2 may be the second opening OP2 formed to overlap the support region SR, which as noted above is free of the horizontal insulating layer 110 (including layers 111, 112, 113). Accordingly, since the second horizontal insulating layer 112 is not disposed and removed in the lower portion of the second opening OP2, the etchant for removing the second horizontal insulating layer 112 in this step may be prevented from being introduced into the upper portion, and thus prevented from damaging upper structures and/or the insulating region IR of the first and second through-wiring regions TR1 and TR2.

Figure 10G:
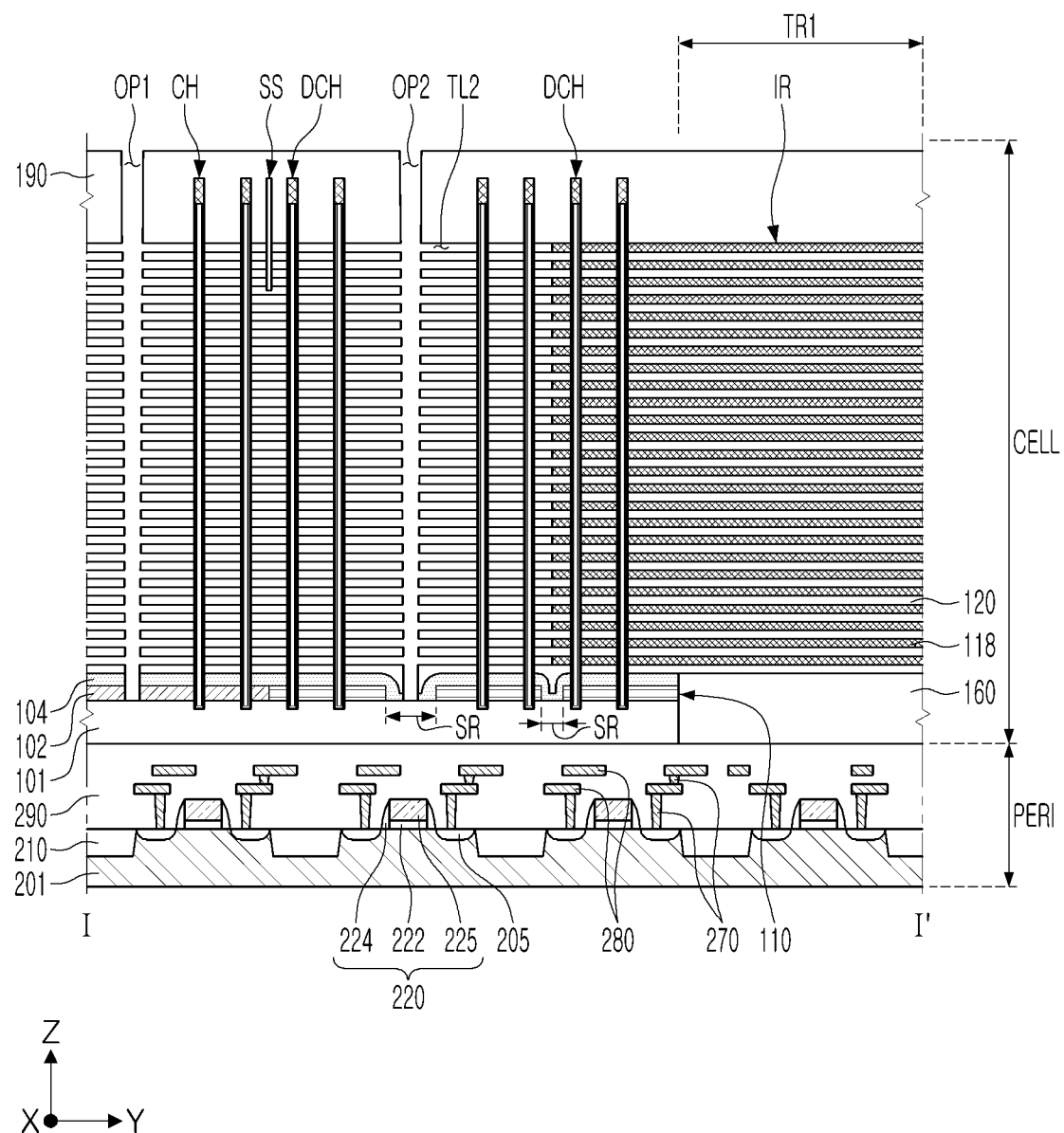

Referring to FIG. 10G, after removing the first and third horizontal insulating layers 111 and 113 in the first tunnel portion TL1 and forming the first horizontal conductive layer 102, second tunnel portions TL2 may be formed by removing portions of the sacrificial insulating layers 118 through the openings OP1 and OP2.

The first and third horizontal insulating layers 111 and 113 may be selectively removed with respect to the interlayer insulating layer 120 and the like. When the first and third horizontal insulating layers 111 and 113 are removed, the gate dielectric layer 145 exposed in the region from which the second horizontal insulating layer 112 has been removed is also partially removed, thereby exposing the channel layer 140 through the first tunnel portion TL1. The first horizontal conductive layer 102 may be formed by depositing a conductive material in the first tunnel portion TL1 from which the horizontal insulating layer 110 has been removed. The sacrificial spacers 115 and the sacrificial oxide layers 116 may be removed.

The sacrificial insulating layers 118 may be removed from a region other than the first and second through-wiring regions TR1 and TR2 (see FIG. 1) and surroundings thereof. The sacrificial insulating layers 118 may be removed selectively with respect to the interlayer insulating layers 120, the first horizontal conductive layer 102, the second horizontal conductive layer 104 and the substrate insulating layer 160 by using, for example, wet etching. Accordingly, a plurality of second tunnel portions TL2 may be formed between the interlayer insulating layers 120, and some sidewalls of the channel structures CH and the dummy channel structures DCH may be exposed through the second tunnel portions TL2.

The regions in which the first and second through-wiring regions TR1 and TR2 are formed are spaced apart from the openings OP1 and OP2, and thus, may include regions in which the sacrificial insulating layers 118 remain (e.g., because the etchant may not reach those regions). Accordingly, the first and second through-wiring regions TR1 and TR2 are formed in the center of the openings OP1 and OP2, between adjacent openings OP1 and OP2. The region in which the sacrificial insulating layers 118 remain may not coincide with the region in which the substrate insulating layer 160 is disposed. Accordingly, when the first and second through-wiring regions TR1 and TR2 are defined with respect to the substrate insulating layer 160, the sacrificial insulating layers 118 may be disposed around the first and second through-wiring regions TR1 and TR2, as well as inside of the first and second through-wiring regions TR1 and TR2.

Figure 10H:
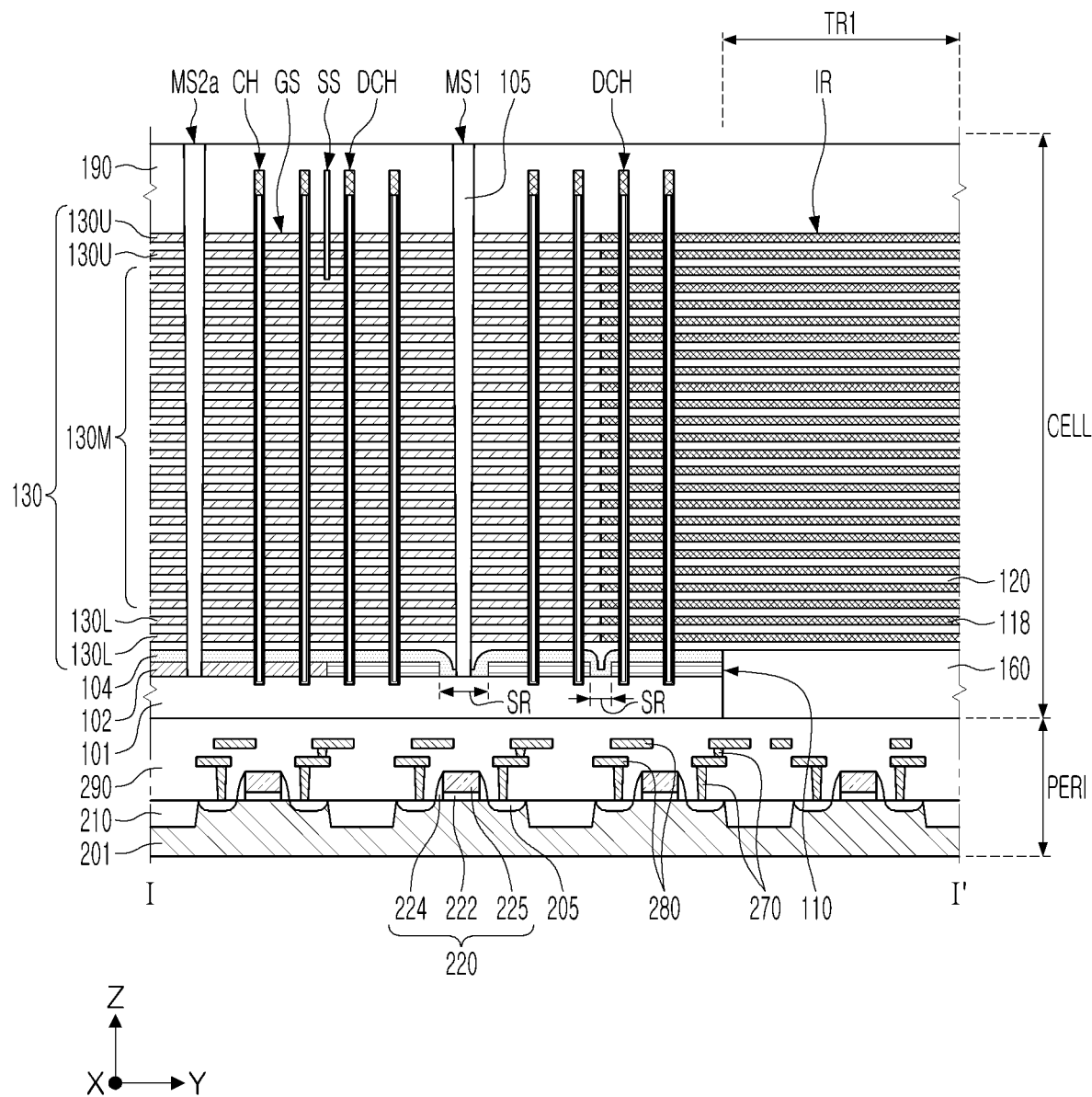

Referring to FIG. 10H, the gate electrodes 130 may be formed by filling the second tunnel portions TL2 with a conductive material, and the separation insulating layer 105 may be formed in the openings OP1 and OP2.

The conductive material constituting the gate electrodes 130 may fill the second tunnel portions TL2. The conductive material may include a metal, polycrystalline silicon, or metal silicide material. Side surfaces of the gate electrodes 130 may contact side surfaces of the sacrificial insulating layers 118. After the gate electrodes 130 are formed, the conductive material deposited in the openings OP1 and OP2 may also be removed through an additional process. The separation insulating layer 105 may be formed to fill the openings OP1 and OP2.

Figure 10I:
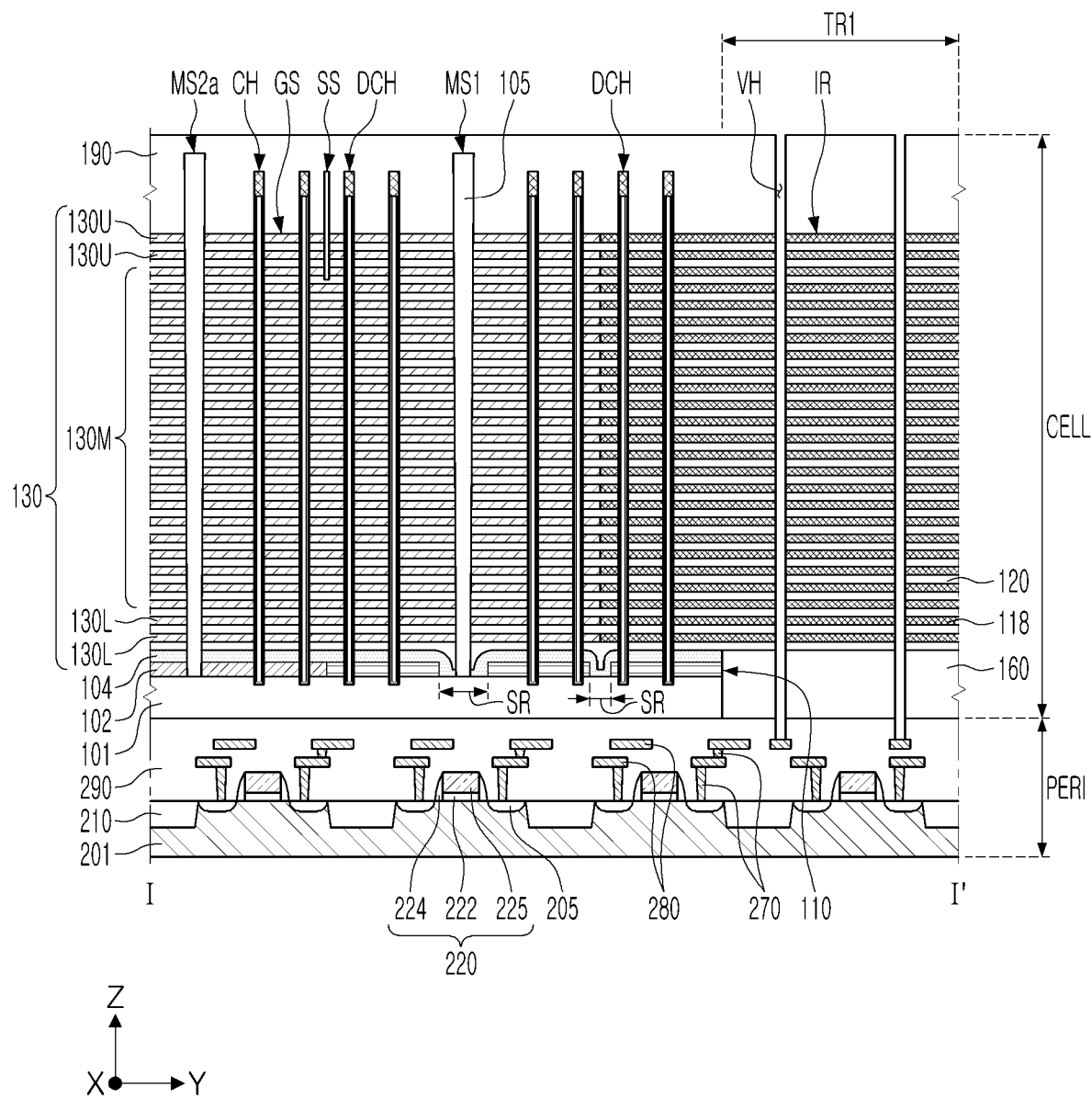

Referring to FIG. 10I, via holes VH in which through-contact plugs 170 (see FIG. 2A) are to be formed may be formed in the first and second through-wiring regions TR1 and TR2.

Before forming the via holes VH, the cell region insulating layer 190 may be further formed to cover the separation insulating layer 105. The via holes VH penetrating through the cell region insulating layer 190 and the insulating region IR may be formed. Circuit wiring lines 280 of the peripheral circuit structure PERI may be exposed to lower ends of the via holes VH.

Referring again to FIG. 2A, the first and second through-wiring regions TR1 and TR2 may be formed, by filling the via holes VH with a conductive material to form the through-contact plugs 170, and the semiconductor device 100 may be manufactured by forming wiring lines 180 connected to upper ends of the through contact plugs 170.

Figure 11:
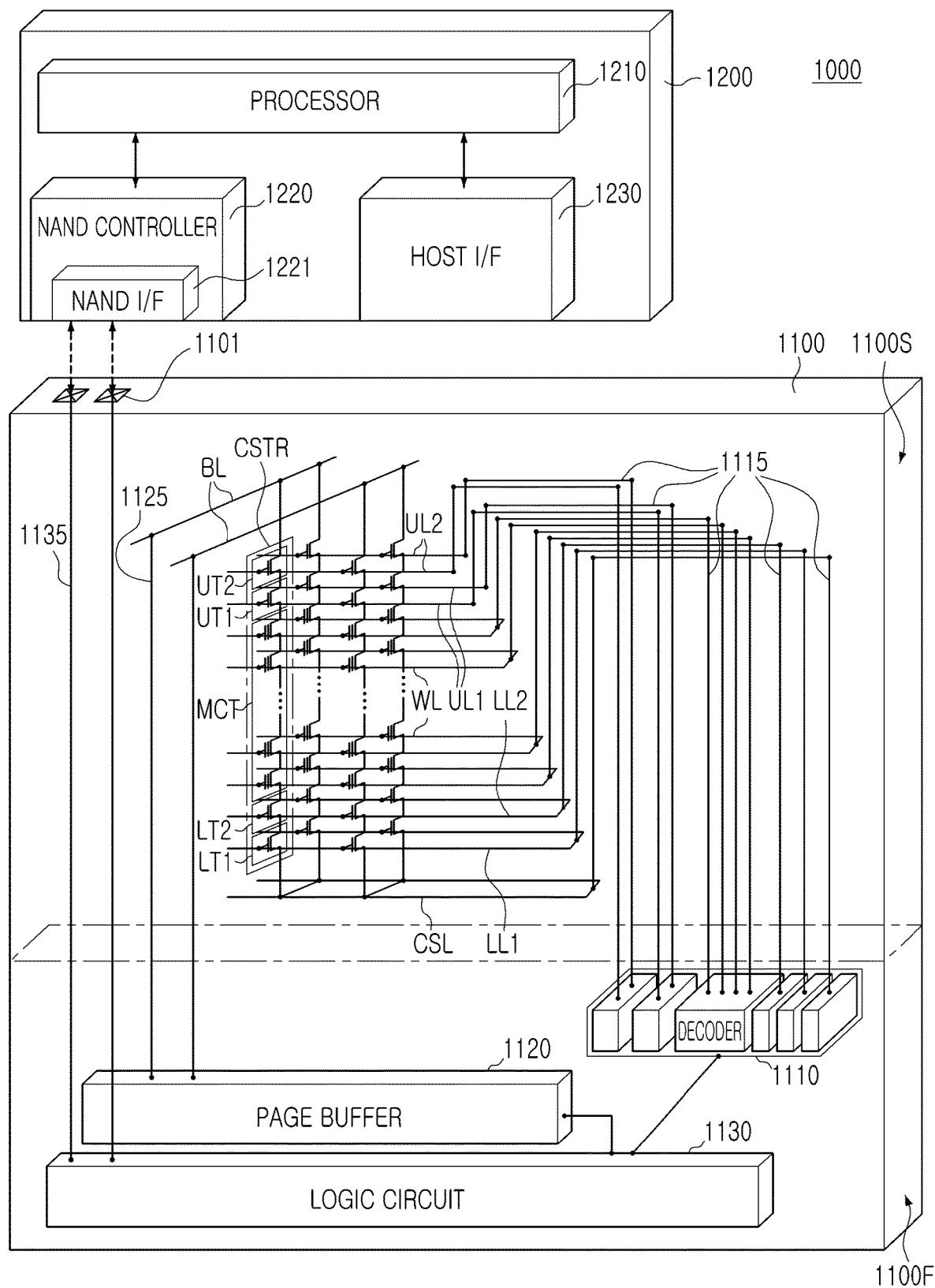
FIG. 11 is a schematic diagram of a data storage system including semiconductor devices according to example embodiments.

FIG. 11 is a schematic diagram of a data storage system including a semiconductor device according to example embodiments.

Referring to FIG. 11, a data storage system 1000 may include a semiconductor device 1100 and a controller 1200 electrically connected to the semiconductor device 1100. The data storage system 1000 may be a storage device including one or a plurality of semiconductor devices 1100 or an electronic device including a storage device. For example, the data storage system 1000 may be a solid state drive (SSD) device, a universal serial bus (USB), a computing system, a medical device or a communication device, including one or a plurality of semiconductor devices 1100.

The semiconductor device 1100 may be a nonvolatile memory device, for example, the NAND flash memory device described above with reference to FIGS. 1 to 9. The semiconductor device 1100 may include a first structure 1100F and a second structure 1100S on the first structure 1100F. In example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously modified according to example embodiments.

In example embodiments, the upper transistors UT1 and UT2 may include a string select transistor, and the lower transistors LT1 and LT2 may include a ground selection transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 connected in series. The upper transistors UT1 and UT2 may include string select transistor UT1 and upper erase control transistor UT2 connected in series. At least one of the lower erase control transistor LT1 and the upper erase control transistor UT1 may be used for an erase operation of erasing data stored in the memory cell transistors MCT using the GIDL phenomenon.

The common source line CSL, the first and second lower gate lines LL1 and LL2, the word lines WL, and the first and second upper gate lines UL1 and UL2 may be electrically connected to the decoder circuit 1110 through first connection wires 1115 extending from the inside of the first structure 1100F to the second structure 1100S. The bit lines BL may be electrically connected to the page buffer 1120 through second connection wires 1125 extending from the inside of the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1000 may communicate with the controller 1200 through an input/output pad 1101 electrically connected to the logic circuit 1130. The input/output pad 1101 may be electrically connected to the logic circuit 1130 through input/output connection wiring 1135 extending from the first structure 1100F to the second structure 1100S.

The controller 1200 may include a processor 1210, a NAND controller 1220, and a host interface 1230. According to example embodiments, the data storage system 1000 may include a plurality of semiconductor devices 1100, in which case the controller 1200 may control the plurality of semiconductor devices 1000.

The processor 1210 may control the overall operation of the data storage system 1000 including the controller 1200. The processor 1210 may operate by a predetermined firmware, and may access the semiconductor device 1100 by controlling the NAND controller 1220. The NAND controller 1220 may include a NAND interface 1221 that processes communication with the semiconductor device 1100. Through the NAND interface 1221, a control command for controlling the semiconductor device 1100, data to be written to the memory cell transistors MCT of the semiconductor device 1100, and data to be read from the memory cell transistors MCT of the semiconductor device 1100 may be transmitted. The host interface 1230 may provide a communication function between the data storage system 1000 and an external host. When a control command is received from an external host through the host interface 1230, the processor 1210 may control the semiconductor device 1100 in response to the control command.

Figure 12:
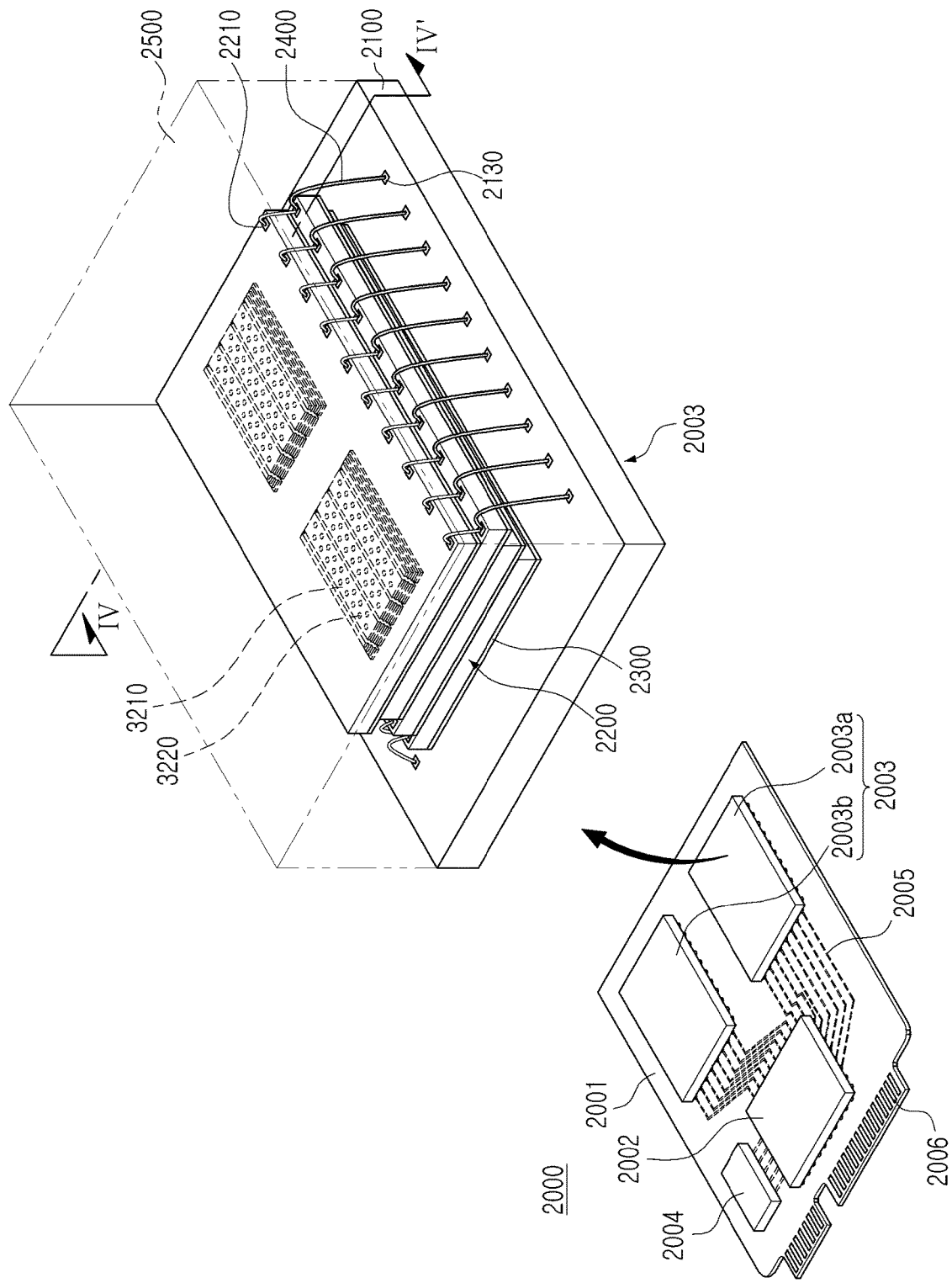
FIG. 12 is a schematic perspective view of a data storage system including a semiconductor device according to an example embodiment.

FIG. 12 is a schematic perspective view of a data storage system including a semiconductor device according to an example embodiment.

Referring to FIG. 12, a data storage system 2000 according to an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins configured to be coupled to an external host. The number and arrangement of the plurality of pins in the connector 2006 may be changed according to a communication interface between the data storage system 2000 and the external host. In example embodiments, the data storage system 2000 may communicate with an external host according to one or more interfaces such as Universal Serial Bus (USB), Peripheral Component Interconnect Express (PCI-Express), Serial Advanced Technology Attachment (SATA), M-Phy for Universal Flash Storage (UFS), and the like. In example embodiments, the data storage system 2000 may be operated by power supplied from an external host through the connector 2006. The data storage system 2000 may further include a Power Management Integrated Circuit (PMIC) that distributes power supplied from the external host to the controller 2002 and the semiconductor package 2003.

The controller 2002 may write data to the semiconductor package 2003 or read data from the semiconductor package 2003, and may improve the operation speed of the data storage system 2000.

The DRAM 2004 may be a buffer memory for reducing a speed difference between the semiconductor package 2003, which is a data storage space, and an external host. The DRAM 2004 included in the data storage system 2000 may also operate as a type of cache memory, and may also provide a space for temporarily storing data in a control operation on the semiconductor package 2003. When the DRAM 2004 is included in the data storage system 2000, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 and the package substrate 2100, and a molding layer 2500 disposed on the package substrate 2100 and covering the semiconductor chips 2200 and the connection structure 2400.

The package substrate 2100 may be a printed circuit board including upper package pads 2130. Each semiconductor chip 2200 may include an input/output pad 2210. The input/output pad 2210 may correspond to the input/output pad 1101 of FIG. 11. Each of the semiconductor chips 2200 may include gate stacked structures 3210 and channel structures 3220. Each of the semiconductor chips 2200 may include the semiconductor devices described above with reference to FIGS. 1 to 9.

In example embodiments, the connection structure 2400 may be a bonding wire electrically connecting the input/output pad 2210 and the upper package pads 2130. Accordingly, in each of the first and second semiconductor packages 2003a and 2003b, the semiconductor chips 2200 may be electrically connected to each other by a bonding wire method, and may be electrically connected to the upper package pads 2130 of the package substrate 2100. According to example embodiments, in each of the first and second semiconductor packages 2003a and 2003b, the semiconductor chips 2200 may be electrically connected to each other by a connection structure including a through-silicon via (TSV), instead of the bonding wire-type connection structure 2400.

In example embodiments, the controller 2002 and the semiconductor chips 2200 may be included in a single package. In an example embodiment, the controller 2002 and the semiconductor chips 2200 may be mounted on a separate interposer substrate different from the main substrate 2001, and the controller 2002 and the semiconductor chips 2200 may be connected to each other by wiring formed on the interposer substrate.

Figure 13:
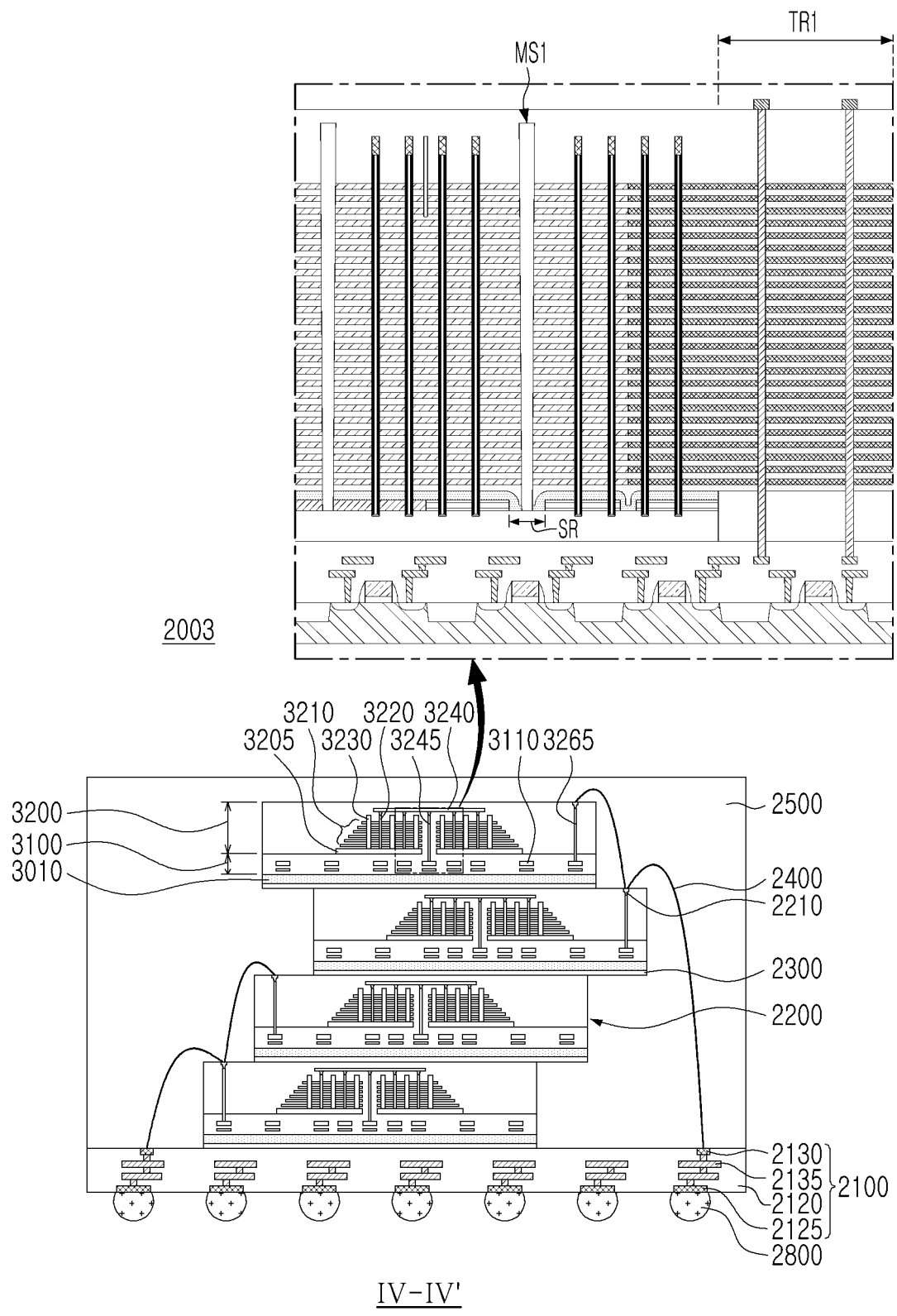
FIG. 13 is a schematic cross-sectional view of a semiconductor package according to an example embodiment.

FIG. 13 is a schematic cross-sectional view of a semiconductor package according to an example embodiment. FIG. 13 illustrates an example embodiment of the semiconductor package 2003 of FIG. 12, and conceptually illustrates a region taken along line IV-IV' of the semiconductor package 2003 of FIG. 12.

Referring to FIG. 13, in the semiconductor package 2003, the package substrate 2100 may be a printed circuit board. The package substrate 2100 may include a package substrate body portion 2120, the upper package pads 2130 disposed on the upper surface of the package substrate body portion 2120, lower package pads 2125 disposed on the lower surface of the package substrate body portion 2120 or exposed through the lower surface thereof, and internal wirings 2135 disposed inside of the package substrate body portion 2120 and electrically connecting the upper package pads 2130 and the lower package pads 2125. The upper package pads 2130 may be electrically connected to the connection structures 2400. The lower package pads 2125 may be connected to the wiring patterns 2005 of the main substrate 2010 of the data storage system 2000 as illustrated in FIG. 12, through conductive connection portions 2800.

Each of the semiconductor chips 2200 may include a semiconductor substrate 3010, and a first structure 3100 and a second structure 3200 sequentially stacked on the semiconductor substrate 3010. The first structure 3100 may include a peripheral circuit region including peripheral wirings 3110. The second structure 3200 may include a common source line 3205, a gate stacked structure 3210 on the common source line 3205, channel structures 3220 and separation regions 3230 penetrating through the gate stacked structure 3210, bit lines 3240 electrically connected to the memory channel structures 3220, and gate contact plugs 175 (see FIG. 1) electrically connected to word lines WL (refer to FIG. 11) of the gate stacked structure 3210. As described above with reference to FIGS. 1 to 2B, in each of the semiconductor chips 2200, the first separation region MS1 adjacent to the through-wiring region TR1 may overlap the support region SR.

Each of the semiconductor chips 2200 may include a through-wiring 3245 that is electrically connected to the peripheral wirings 3110 of the first structure 3100 and extends into the second structure 3200. The through-wiring 3245 may penetrate through the gate stacked structure 3210 and may be further disposed outside of the gate stacked structure 3210. Each of the semiconductor chips 2200 may further include an input/output connection wiring 3265 electrically connected to the peripheral wirings 3110 of the first structure 3100 and extending into the second structure 3200, and an input/output pad 2210 electrically connected to the input/output connection wiring 3265.

As set forth above, according to example embodiments, semiconductor devices having improved reliability and data storage systems including the same may be provided by disposing separation regions that are adjacent to a through-wiring region to overlap a support region.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
a peripheral circuit structure comprising a first substrate and circuit elements on the first substrate;
a memory cell structure comprising:
a second substrate on the first substrate;
gate electrodes spaced apart from each other and stacked in a first direction that is perpendicular to a surface of the second substrate;
channel structures extending through the gate electrodes in the first direction, each of the channel structures comprising a channel layer;
separation regions penetrating through the gate electrodes, extending in a second direction that is perpendicular to the first direction, and spaced apart from each other in a third direction that is perpendicular to the first direction and the second direction;
a first horizontal conductive layer, which is distinct from the gate electrodes, extending on the second substrate and in contact with the channel layer of each of the channel structures;
a horizontal insulating layer extending in parallel with the first horizontal conductive layer; and
a second horizontal conductive layer, which is distinct from the gate electrodes, on the first horizontal conductive layer and in contact with support regions of the second substrate, wherein the support regions are free of the first horizontal conductive layer and the horizontal insulating layer; and
a through-wiring region between first separation regions among the separation regions, the through-wiring region comprising an insulating region and through-contact plugs extending through the insulating region and through the second substrate in the first direction to electrically connect the memory cell structure and the peripheral circuit structure,
wherein first portions of the support regions extend along the first separation regions, and wherein the second horizontal conductive layer conformally extends on respective top surfaces and end portions of the horizontal insulating layer at opposing sides of the first separation regions, and contacts the first portions of the support regions between the respective end portions of the horizontal insulating layer.

2. The semiconductor device of claim 1, wherein the first separation regions are respectively in direct contact with the second horizontal conductive layer on the opposing sides of the first separation regions in the third direction, and wherein the first separation regions are spaced apart from the first horizontal conductive layer and are spaced apart from the respective end portions of the horizontal insulating layer in the third direction with the second horizontal conductive layer therebetween.

3. The semiconductor device of claim 1, wherein the second substrate comprises a first region and a second region,
wherein the gate electrodes are stacked in the first direction in the first region, and define a step shape in the second direction in the second region, and
wherein the through-wiring region is in the first region.

4. The semiconductor device of claim 1, wherein the separation regions further comprise second separation regions respectively spaced apart from the first separation regions in the third direction, wherein the first separation regions overlap the support regions in the first direction, and
wherein the second separation regions are spaced apart from the support regions in the third direction, and do not overlap the support regions in the first direction.

5. The semiconductor device of claim 4, wherein respective side surfaces of the first horizontal conductive layer and the horizontal insulating layer contact each other between one of the first separation regions and one of the second separation regions that are adjacent to each other.

6. The semiconductor device of claim 1, wherein the memory cell structure further comprises dummy channel structures around the first separation regions,
wherein the dummy channel structures penetrate through the horizontal insulating layer.

7. The semiconductor device of claim 1, wherein second portions of the support regions extend in the second direction between the through-wiring region and the first separation regions in the third direction.

8. The semiconductor device of claim 1, wherein the separation regions further comprise second separation regions adjacent to the first separation regions,
wherein the second separation regions extend through the second horizontal conductive layer in the support regions.

9. The semiconductor device of claim 1, wherein the second substrate comprises a first region and a second region,
wherein the gate electrodes are stacked in the first direction in the first region, and define a step shape in the second direction in the second region, and
wherein the through-wiring region is in the second region.

10. The semiconductor device of claim 9, wherein the support regions extend around at least a portion of the separation regions adjacent to the through-wiring region in the second direction and the third direction.

11. The semiconductor device of claim 1, wherein the horizontal insulating layer comprises a first horizontal insulating layer, a second horizontal insulating layer, and a third horizontal insulating layer sequentially stacked on the second substrate, and
wherein the first horizontal insulating layer and the third horizontal insulating layer comprise a same material.

12. A semiconductor device comprising:
a peripheral circuit structure comprising a first substrate and circuit elements on the first substrate;
a memory cell structure comprising a second substrate on the first substrate, a first horizontal conductive layer extending on the second substrate, a horizontal insulating layer extending in parallel with the first horizontal conductive layer, a second horizontal conductive layer on the first horizontal conductive layer, gate electrodes spaced apart from each other and stacked on the second horizontal conductive layer in a first direction, wherein the first and second horizontal conductive layers are distinct from the gate electrodes, channel structures extending through the gate electrodes in the first direction and each comprising a channel layer, and separation regions penetrating the gate electrodes, extending in a second direction different than the first direction, and spaced apart from each other in a third direction different from the first and second directions; and a through-wiring region between first separation regions among the separation regions, the through-wiring region comprising a through-contact plug extending in the first direction and electrically connecting one or more elements of the memory cell structure and one or more of the circuit elements of the peripheral circuit structure, wherein the first separation regions are adjacent to the through-contact plug in the third direction, wherein the first separation regions extend through the second horizontal conductive layer and are spaced apart from the first horizontal conductive layer, wherein the second horizontal conductive layer conformally extends on respective top surfaces and end portions of the horizontal insulating layer at opposing sides of the first separation regions, and contacts the second substrate between the respective end portions of the horizontal insulating layer to define respective support regions, and wherein the support regions are free of the first horizontal conductive layer and the horizontal insulating layer.

13. A data storage system comprising:
a semiconductor storage device comprising:
a peripheral circuit structure comprising a first substrate and circuit elements on the first substrate;
a memory cell structure comprising a second substrate on the first substrate, a first horizontal conductive layer extending on the second substrate, a horizontal insulating layer extending in parallel with the first horizontal conductive layer, a second horizontal conductive layer on the first horizontal conductive layer, gate electrodes spaced apart from each other and stacked on the second horizontal conductive layer in a first direction, wherein the first and second horizontal conductive layers are distinct from the gate electrodes, channel structures extending through the gate electrodes in the first direction and each comprising a channel layer, and separation regions penetrating through the gate electrodes, extending in a second direction that is different from the first direction, and spaced apart from each other in a third direction that is different from the first and second directions;

an input/output pad electrically connected to the circuit elements; and a through-wiring region between first separation regions among the separation regions, the through-wiring region comprising a through-contact plug extending in the first direction and electrically connecting one or more elements of the memory cell structure and one or more of the circuit elements of the peripheral circuit structure, wherein the first separation regions are adjacent to the through-contact plug in the third direction, wherein the first separation regions extend through the second horizontal conductive layer and are spaced apart from the first horizontal conductive layer, wherein the second horizontal conductive layer conformally extends on respective top surfaces and end portions of the horizontal insulating layer at opposing sides of the first separation regions, and contacts the second substrate between the respective end portions of the horizontal insulating layer to define respective support regions that are free of the first horizontal conductive layer and the horizontal insulating layer; and a controller electrically connected to the semiconductor storage device through the input/output pad.

14. The data storage system of claim 13, wherein first portions of the support regions are in contact with and extend along the first separation regions.

15. The semiconductor device of claim 1, wherein the horizontal insulating layer is interposed between the first separation regions and the first horizontal conductive layer in the third direction.

16. The semiconductor device of claim 9, wherein a third portion of the support regions extends in the third direction at a boundary between the first region and the second region.

* * * * *